(12) United States Patent
Yu et al.

(10) Patent No.: US 11,854,936 B2
(45) Date of Patent: Dec. 26, 2023

(54) SEMICONDUCTOR DEVICE

(71) Applicant: Taiwan Semiconductor Manufacturing Company, Ltd., Hsinchu (TW)

(72) Inventors: Chen-Hua Yu, Hsinchu (TW); Chun-Hui Yu, Hsinchu County (TW); Jeng-Nan Hung, Taichung (TW); Kuo-Chung Yee, Taoyuan (TW); Po-Fan Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/155,067

(22) Filed: Jan. 17, 2023

(65) Prior Publication Data
US 2023/0170280 A1   Jun. 1, 2023

Related U.S. Application Data

(63) Continuation of application No. 16/916,115, filed on Jun. 30, 2020, now Pat. No. 11,574,853.

(51) Int. Cl.
*H01L 23/46* (2006.01)
*H01L 23/367* (2006.01)
*H01L 23/31* (2006.01)
*H01L 23/00* (2006.01)
*H01L 23/433* (2006.01)

(52) U.S. Cl.
CPC .......... *H01L 23/46* (2013.01); *H01L 23/3157* (2013.01); *H01L 23/367* (2013.01); *H01L 23/433* (2013.01); *H01L 24/29* (2013.01); *H01L 2224/29018* (2013.01)

(58) Field of Classification Search
CPC ... H01L 23/46; H01L 23/3157; H01L 23/367; H01L 23/433; H01L 24/29; H01L 2224/29018
See application file for complete search history.

(56) References Cited

U.S. PATENT DOCUMENTS

| | | | | |
|---|---|---|---|---|
| 5,023,695 | A * | 6/1991 | Umezawa | H01L 23/4735 257/714 |
| 2012/0119346 | A1* | 5/2012 | Im | H01L 21/563 257/E23.18 |
| 2019/0385925 | A1* | 12/2019 | Walczyk | H01L 21/4882 |
| 2019/0385929 | A1* | 12/2019 | Ku | H01L 25/0655 |

* cited by examiner

Primary Examiner — Peniel M Gumedzoe
(74) Attorney, Agent, or Firm — JCIPRNET

(57) ABSTRACT

A semiconductor device including a substrate, a semiconductor package, a thermal conductive bonding layer, and a lid is provided. The semiconductor package is disposed on the substrate. The thermal conductive bonding layer is disposed on the semiconductor package. The lid is attached to the thermal conductive bonding layer and covers the semiconductor package to prevent coolant from contacting the semiconductor package.

20 Claims, 34 Drawing Sheets

SEMICONDUCTOR DEVICE

CROSS-REFERENCE TO RELATED APPLICATION

This application is a continuation application of and claims the priority benefit of a prior application Ser. No. 16/916,115, filed on Jun. 30, 2020. The entirety of the above-mentioned patent application is hereby incorporated by reference herein and made a part of this specification.

BACKGROUND

A typical problem with miniaturization of semiconductor devices is heat dissipation during operation. A prolonged exposure of a die by operating at excessive temperatures may decrease the reliability and lifetime of the die. This problem may become severe if the die generates a lot of heat during operation. As such, improvements to heat transfer are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
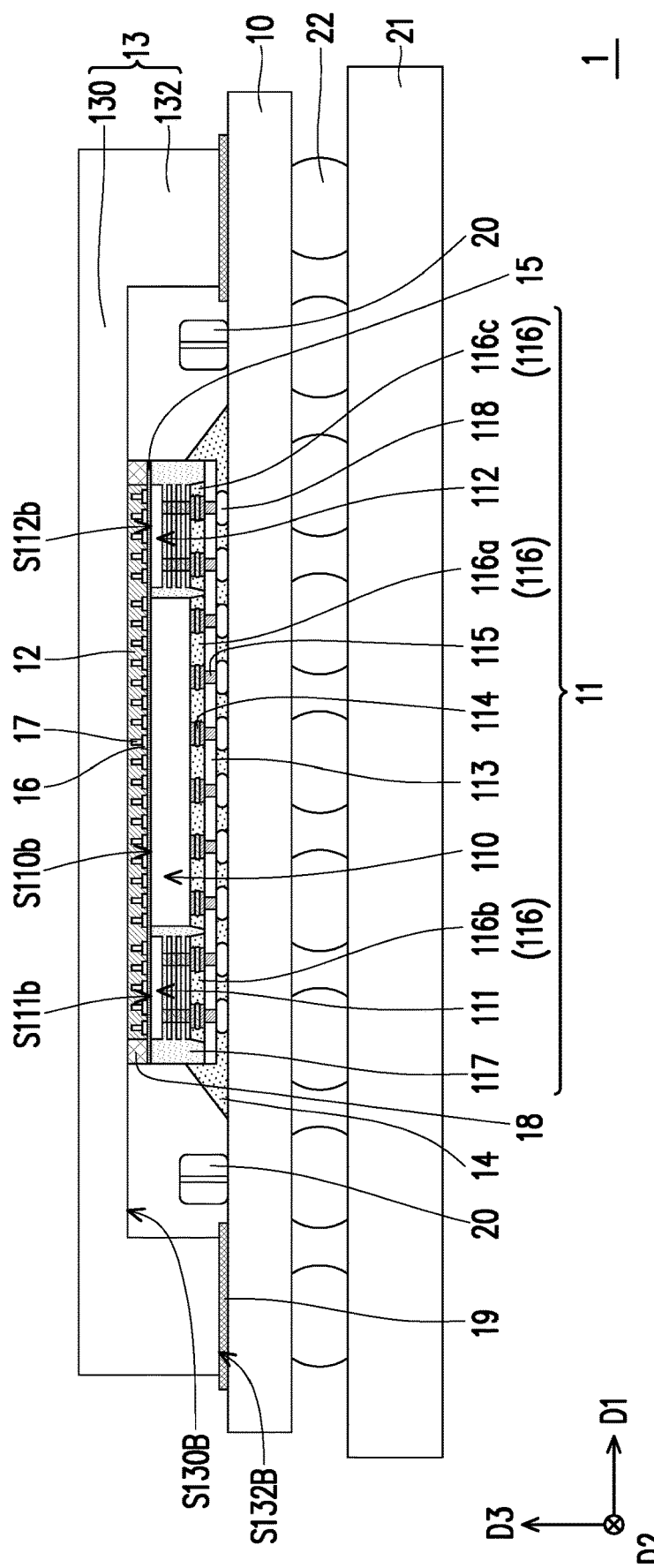
FIG. 1 through FIG. 27 are cross-sectional views schematically illustrating semiconductor devices according to some embodiments of the present disclosure.

Corresponding numerals and symbols in the different figures generally refer to corresponding parts unless otherwise indicated. The figures are drawn to clearly illustrate the relevant aspects of the embodiments and are not necessarily drawn to scale. Furthermore, dashed outlines depict regions where a layer or a component of the package is beneath or behind another layer or component.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 27 are cross-sectional views schematically illustrating semiconductor devices according to some embodiments of the present disclosure.

Referring to FIG. 1, a semiconductor device 1 may include a substrate 10, a semiconductor package 11, a thermal conductive bonding layer 12, and a lid 13.

The substrate 10 may include elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the substrate 10 includes silicon on insulator (SOI) or silicon-germanium on insulator (SGOI). In some embodiments, the substrate 10 includes active components (e.g., transistors or the like) formed therein. In some embodiments, the substrate 10 includes passive components (e.g., resistors, capacitors, inductors, or the like) formed therein. In some embodiments, the substrate 10 includes a silicon wafer. In some embodiments, the substrate 10 is a package substrate or ball grid array (BGA) substrate including one or more active components, passive components, or a combination thereof. In some embodiments, the substrate 10 also includes interconnection structures and/or redistribution layers (not shown) to connect various components therein to form functional circuitry. In some embodiments, the substrate 10 may be provided for dual-side electrical connection.

The semiconductor package 11 is disposed on the substrate 10. The semiconductor package 11 may include at least one semiconductor die. FIG. 1 schematic shows semiconductor dies 110, 111 and 112 arranged in a first direction D1. In some embodiments, the semiconductor package 11 further includes other semiconductor dies (not shown) arranged in a second direction D2. The first direction D1 and the second direction D2 are both perpendicular to a normal direction D3 of the substrate 10. The second direction D2 intersects the first direction D1 and is, for example, perpendicular to each other.

In some embodiments, the semiconductor package 11 further includes an interposer 113, connectors 114, through vias 115, an underfill 116, an encapsulant 117 and connectors 118 in addition to the at least one semiconductor die (e.g., the semiconductor dies 110, 111 and 112).

Each of the semiconductor dies 110, 111 and 112 may include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 110, 111 and 112 include a memory die such as a high bandwidth memory die. In some embodiments, the semiconductor dies 110, 111 and 112 may be the same type of dies or perform the same functions. In some embodiments, the semiconductor dies 110, 111 and 112 may be different types of dies or perform different functions. In some embodiments, the semiconductor die 110 includes a logic die, and the semiconductor dies 111 and 112 include memory dies. In some embodiments, the semiconductor dies 111 and 112 are memory stacks, including multiple chips (not marked) stacked on top of each other and electrically connected by connectors (not marked). When the memory die include multiple chips, an insulating layer may be disposed between adjacent chips to protect the chips and the connectors. In some embodiments, a material of the insulating layer may include an encapsulant, a molding underfill, an epoxy, or a resin.

The semiconductor dies 110, 111 and 112 are bonded via the connectors 114 to through vias 115 formed within the interposer 113. A material of the connectors 114 may include copper, copper alloys, or other conductive materials, and the connectors 114 may be formed by deposition, plating, or other suitable techniques. In some embodiments, the connectors 114 are prefabricated structures attached to contact pads (not shown) of the semiconductor dies 110, 111 and 112. In some embodiments, the connectors 114 are solder balls, metal pillars, controlled collapse chip connection bumps, micro bumps, bumps formed via electroless nickel-electroless palladium-immersion gold technique (ENEPIG), combination thereof (e. g, a metal pillar with a solder ball attached), or the like. The interposer 113 may be made of a semiconductor material similar to those previously discussed with reference to the substrate 10, and will not be repeated here. A material of the through vias 115 may include one or more metals such as copper, titanium, tungsten, aluminum, the alloys, the combinations or the like.

The underfill 116 may be disposed between the semiconductor dies 110, 111 and 112 and the interposer 113 to protect the connectors 114 against thermal or physical stresses and secure the electrical connection of the semiconductor dies 110, 111 and 112 with the through vias 115. In some embodiments, the underfill 116 is formed by capillary underfill filling (CUF). A dispenser (not shown) may apply a filling material (not shown) along the perimeter of the semiconductor dies 110, 111 and 112. In some embodiments, a heating process is performed to let the filling material penetrate in the interstices defined by the connectors 114 between the semiconductor dies 110, 111 and 112 and the interposer 113 by capillarity. In some embodiments, a curing process is performed to consolidate the underfill 116. In some embodiments, the underfill 116 includes underfill portions 116a, 116b and 116c spaced apart from each other, wherein the underfill portion 116a is formed between the semiconductor die 110 and the interposer 113, the underfill portion 116b is formed between the semiconductor die 111 and the interposer 113, and the underfill portion 116c is formed between the semiconductor die 112 and the interposer 113. In some alternative embodiments, a single underfill (not shown) may extend below the semiconductor dies 110, 111 and 112 depending on the spacing and relative positions of the semiconductor dies 110, 111 and 112.

The encapsulant 117 may be formed on the interposer 113. The encapsulant 117 may cover the underfill 116 and surround the semiconductor dies 110, 111 and 112. In some embodiments, the encapsulant 117 is formed by completely covering the semiconductor dies 110, 111 and 112 with an encapsulation material (not shown), and then performing a planarization process (e.g., a mechanical grinding process and/or a chemical mechanical polishing step) until backside surfaces S110b, S111b and S112b of the semiconductor dies 110, 111 and 112 are exposed. In some embodiments, the encapsulation material may be a molding compound, a molding underfill, a resin (such as an epoxy resin), glue, or the like. In some embodiments, the encapsulation material is formed by an over-molding process. In some embodiments, the encapsulation material is formed by at least one of a compression molding process, an immersion molding process and a transfer molding process. In some embodiments, the encapsulation material may require a curing process.

The through vias 115 may be bonded to the substrate 10 via the connectors 118. A method of forming the connectors 118 and a material of the connectors 118 may be similar to those previously discussed with reference to the connectors 114, and will not be repeated here.

The thermal conductive bonding layer 12 is disposed on the semiconductor package 11 and adapted to reduce contact thermal resistance and improve heat dissipation performance. The thermal conductive bonding layer 12 may include a thermal interface material (TIM), graphite, solder paste, nano silver paste, or other bonding material with high thermal conductivity. The thermal interface material may include a thermal grease (or thermal paste), a thermal gel, a thermal pad, a phase-change material (PCM), a phase change metal alloy, or a thermal conductive adhesive. Composition of the thermal grease may include silicon oil base, zinc oxide (ZnO), or silver (Ag), but not limited thereto. Composition of the thermal gel may include aluminum (Al), silver (Ag), silicon oil, olefin, or paraffin wax, but not limited thereto. Composition of the thermal pad may include silicone rubber, glass fiber, polyester based material, or silicone oil filled material, but not limited thereto. Composition of the phase-change material may include polyolefin resin, acrylic, aluminum (Al), aluminum oxide, or carbon nanofiber tube, but not limited thereto. Composition of the phase change metal alloy may include indium (In), alloy of indium (In) and silver (Ag), alloy of tin (Sn), silver (Ag) and copper (Cu), alloy of indium (In), tin (Sn) and bismuth (Bi), but not limited thereto. Composition of the thermal conductive adhesive may include epoxy, iron (Fe), silver (Ag), or nickel (Ni), but not limited thereto. In some embodiments, the thermal conductive bonding layer 12 is disposed on the semiconductor package 11 through coating, printing, placing, etc. In some embodiments, the thermal conductive bonding layer 12 may require curing. In some alternative embodiments, the thermal conductive bonding layer 12 may not require curing.

The lid 13 is connected to the thermal conductive bonding layer 12. In some embodiments, the lid 13 includes a plate portion 130 and a frame portion 132. The plate portion 130 covers the semiconductor package 11 and connected to the thermal conductive bonding layer 12. In some embodiments, the plate portion 130 extends substantially parallel to the substrate 10. The frame portion 132 is located at edges of the plate portion 130 and protrudes towards the substrate 10. In some embodiments, the semiconductor package 11 may be enclosed by the substrate 10, the frame portion 132 and the plate portion 130. In some embodiments, the frame portion 132 extends in a direction (e.g., an opposite direction of the normal direction D3) perpendicular to the substrate 10. In some embodiments, a material of the lid 13 includes a thermally conductive material. In some embodiments, the material of the lid 13 includes metals or metal alloys, such as copper, aluminum, their alloys, the combinations thereof or the like. In some embodiments, the material of the lid 13 includes a semiconductor material such as silicon. In some embodiments, the material of the lid 13 includes polyimide, epoxy resin, acrylic resin (e.g., polymethylmethacrylate, PMMA), phenol resin, benzocyclobutene (BCB), polybenzoxazole (PBO), or any other suitable polymer-based material. In some embodiments, the material of the lid 13 includes metal diamond composites, such as Cu diamond, silver diamond, Al diamond, or the like. In some embodiments, the lid 13 is molded, forged, 3D-printed, grown, or fabricated according to any other suitable technique. In some embodiments, multiple portions (e.g., the plate portion 130 and the frame portion 132) of the lid 13 are fabricated separately and then assembled through additional elements (e.g., screws, adhesives, or combination thereof). In some alternative embodiments, multiple portions of the lid 13 are fabricated separately and then assembled (e.g., welded) without additional elements. In other alternative embodiments, multiple portions of the lid 13 are integrally formed.

In some embodiments, the semiconductor device 1 further includes an underfill 14 disposed between the semiconductor package 11 and the substrate 10 to protect the connectors 118 against thermal or physical stresses and secure the electrical connection of the semiconductor package 11 with the substrate 10. A method of forming the underfill 14 and a material of the underfill 14 may be similar to those previously discussed with reference to the underfill 116, and will not be repeated here.

In some embodiments, the semiconductor device 1 further includes a backside metal layer 15 disposed between the thermal conductive bonding layer 12 and the semiconductor package 11 to improve heat dissipation or conductivity. The backside metal layer 15 may be formed at least on the backside surface (including the backside surfaces S110*b*, S111*b* and S112*b* of the semiconductor dies 110, 111 and 112) of the semiconductor package 11. In some embodiments, the backside metal layer 15 is further formed on side surfaces of the semiconductor package 11 and on the underfill 14. In some embodiments, after the semiconductor package 11 and the underfill 14 are formed on the substrate 10, a shielding element (not shown; e.g., a jig or a protection tape) is disposed on the substrate 10. The shielding element has an opening that exposes the region (e.g., a region in which the semiconductor package 11 and the underfill 14 are located) where the backside metal layer 15 is to be formed. The material of the backside metal layer 15 is then formed on the shielding element and the elements (e.g., the semiconductor package 11 and the underfill 14) exposed by the opening of the shielding element through a sputtering process, a physical vapor deposition (PVD) process, a plating process, an electron beam evaporation process, or the like. In some embodiments, the backside metal layer 15 may include a stacked layer of titanium (Ti) and copper (Cu), a stacked layer of diamond-like carbon (DLC), titanium (Ti) and copper (Cu), a stacked layer of titanium (Ti), copper (Cu) and nickel (Ni), or a stacked layer of titanium (Ti), copper (Cu) and vanadium (V), but not limited thereto.

In some embodiments, the semiconductor device 1 further includes a plurality of bonding patterns (or bonding pads) 16 disposed between the thermal conductive bonding layer 12 and the backside metal layer 15. In some embodiments, a material of the plurality of bonding patterns 16 includes solder paste, nano silver paste, or other bonding material with high thermal conductivity. In some embodiments, the plurality of bonding patterns 16 are formed through a printing process, such as a stencil printing process, but not limited thereto.

In some embodiments, the semiconductor device 1 further includes a plurality of pillars 17 disposed on the semiconductor package 11 and located between the thermal conductive bonding layer 12 and the backside metal layer 15. The plurality of pillars 17 may be disposed on the plurality of bonding patterns 16 and overlapped with the semiconductor dies 110, 111 and 112 in the normal direction D3 of the substrate 10. The plurality of pillars 17 are adapted to dissipate heat generated during the operation of the semiconductor dies 110, 111 and 112 through heat conduction, and the plurality of pillars 17 may be disposed closer to the semiconductor dies 110, 111 and 112 to dissipate heat more efficiently. In some embodiments, a material of the plurality of pillars 17 includes copper, nanotube or other high thermal conductivity materials. In some embodiments, the high thermal conductivity includes metal diamond composites, such as Cu diamond, silver diamond, Al diamond, or the like. In some embodiments, the plurality of pillars 17 are formed through a placement process, and the plurality of bonding patterns 16 may be omitted. In some alternative embodiments, the plurality of pillars 17 are formed on the plurality of bonding patterns 16 through a plating process.

In some embodiments, the semiconductor device 1 further includes a protection layer (not shown in FIG. 1) disposed on the plurality of pillars 17, the plurality of bonding patterns 16 (if any), and the semiconductor package 11. In some embodiments, a material of the protection layer includes diamond like carbon (DLC) or other coating material with high thermal conductivity. In some embodiments, the protection layer is formed through a thin film deposition process, such as a physical vapor deposition (PVD) process, a chemical vapor deposition (CVD) process, a spraying process, a coating process, or the like. The semiconductor device of any of the following embodiments can be improved as described above, and will not be described again below.

In some embodiments, the semiconductor device 1 further includes a bonding layer 18 bonding the lid 13 on the semiconductor package 11. In some embodiments, the space enclosed by the lid 13, the backside metal layer 15, the plurality of bonding patterns 16, the plurality of pillars 17, and the bonding layer 18 may be fully filled by the thermal conductive bonding layer 12. In some embodiments, the bonding layer 18 is formed on a bottom surface S130B of the plate portion 130, and then the lid 13 on which the bonding layer 18 is formed is attached to the semiconductor package 11. In some alternative embodiments, the bonding layer 18 is formed on the semiconductor package 11, and then the lid 13 is attached to the bonding layer 18 on the semiconductor package 11. The bonding layer 18 may be made of a heat resistant material, and the bonding layer 18 may provide buffer or compensation for assembly of the lid 13. In some embodiments, a material of the bonding layer 18 includes die attach film (DAF) or other adhesive material such as thermocurable adhesives, photocurable adhesives, thermally conductive adhesive, thermosetting resin, waterproof adhesive, lamination adhesive or a combination thereof. In some embodiments, the bonding layer 18 includes a metallic layer (not shown) with solder paste (not shown) deposited thereon. In some alternative embodiments, the lid 13 is fixed on the semiconductor package 11 through a fixing mechanism (not shown), and the bonding layer 18 may be omitted.

In some embodiments, the semiconductor device 1 further includes a bonding layer 19 bonding the lid 13 on the substrate 10. In some embodiments, the bonding layer 19 is formed on a bottom surface S132B of the frame portion 132, and then the lid 13 on which the bonding layer 19 is formed is attached to the substrate 10. In some alternative embodiments, the bonding layer 19 is formed on the substrate 10, and then the lid 13 is attached to the bonding layer 19 on the substrate 10. A material of the bonding layer 19 may be similar to those previously discussed with reference to the bonding layer 18, and will not be repeated here. In some alternative embodiments, the lid 13 is fixed on the substrate 10 through a fixing mechanism (not shown), and the bonding layer 19 may be omitted.

In some embodiments, the semiconductor device 1 further includes a plurality of passive components 20 disposed on the substrate 10. In some embodiments, the plurality of passive components 20 as well as the semiconductor package 11 are enclosed by the substrate 10, the frame portion 132 and the plate portion 130. In some embodiments, the plurality of passive components 20 are covered by the plate portion 130 and located between the frame portion 132 and the semiconductor package 11. In some embodiments, the plurality of passive components 20 are resistors, capacitors, inductors, or the like.

In some embodiments, the semiconductor device 1 further includes a printed circuit board (PCB) 21 and connectors 22, and the substrate 10 may be bonded to the printed circuit board 21 via the connectors 22. A method of forming the connectors 22 and a material of the connectors 22 may be similar to those previously discussed with reference to the connectors 114, and will not be repeated here.

In some embodiments, as shown in FIG. 1, the lid 13 covers the semiconductor package 11 to prevent coolant (not shown) from contacting the semiconductor package 11. Specifically, the heat generated during the operation of the semiconductor dies 110, 111 and 112 may be taken away by the coolant flowing on the lid 13. By covering the semiconductor package 11 with the lid 13 to prevent the coolant from contacting the semiconductor package 11, the reliability of the semiconductor device 1 can be improved. Moreover, by disposing the plurality of pillars 17 closer to the heat sources (e.g., disposing the plurality of pillars 17 on the semiconductor package 11), the heat dissipation of the semiconductor device 1 may be improved, the structure design and manufacturing process of the lid 13 can be simplified, and the difficulty of assembly may be reduced. In some embodiments, by controlling the thickness of the bonding layer 18 or 19 or controlling the thickness of the frame portion 132, the bottom surface S130B of the plate portion 130 are spaced apart from the plurality of pillars 17, so that the integrity of the plurality of pillars 17 can be maintained during assembly (avoiding deformation of the plurality of pillars 17 by external forces), the flexibility of assembly can be improved, or the influence of the alignment offset on the heat dissipation effect can be reduced.

Figure 2:
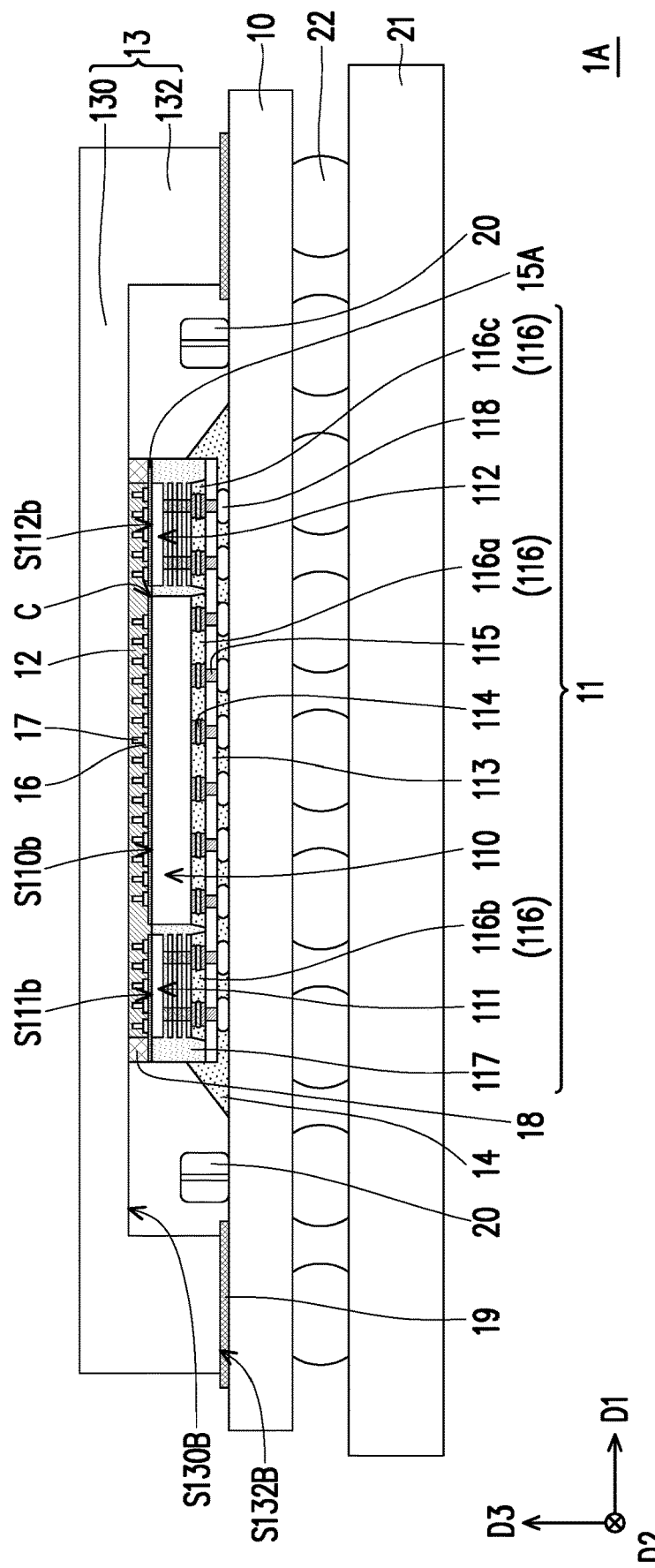

Referring to FIG. 2, a semiconductor device 1A may include a backside metal layer 15A in addition to the substrate 10, the semiconductor package 11, the thermal conductive bonding layer 12, the lid 13, the underfill 14, the plurality of bonding patterns 16, the plurality of pillars 17, the bonding layer 18, the bonding layer 19, the plurality of passive components 20, the printed circuit board 21, and the connectors 22 described above.

The backside metal layer 15A is similar to those previously discussed with reference to the backside metal layer 15 in FIG. 1. However, the backside metal layer 15A is a patterned layer having a plurality of cavities C. In some embodiments, each of the plurality of cavities C is located between two adjacent semiconductor dies (e.g., between the semiconductor die 110 and the semiconductor die 111 or between the semiconductor die 110 and the semiconductor die 112) and exposes the encapsulant 117 located between the two adjacent semiconductor dies. In some embodiments, the thermal conductive bonding layer 12 extends into the plurality of cavities C of the backside metal layer 15A and is in contact with the encapsulant 117 exposed by the plurality of cavities C. The semiconductor device of any of the following embodiments can be improved as described above, and will not be described again below.

Figure 3:
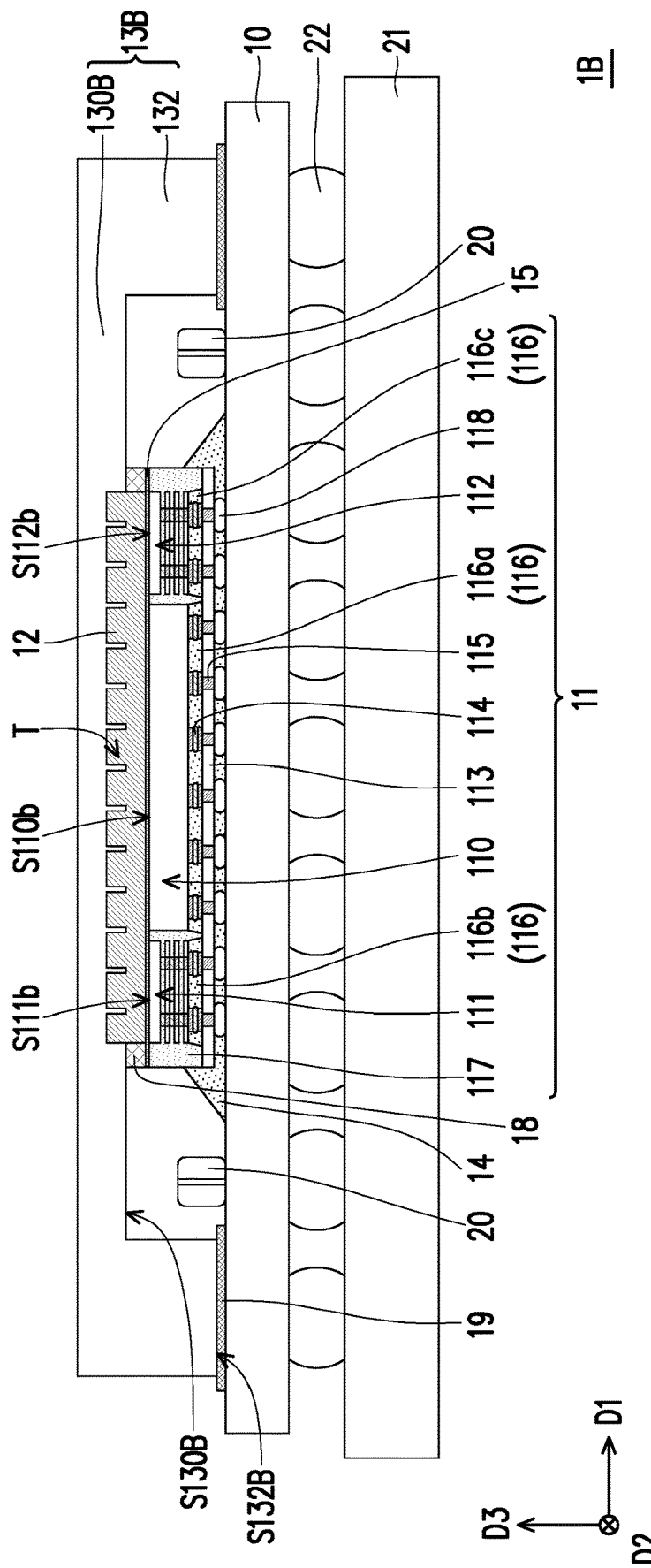

Referring to FIG. 3, a semiconductor device 1B may include a lid 13B in addition to the substrate 10, the semiconductor package 11, the thermal conductive bonding layer 12, the underfill 14, the backside metal layer 15, the bonding layer 18, the bonding layer 19, the plurality of passive components 20, the printed circuit board 21, and the connectors 22 described above.

The lid 13B is similar to those previously discussed with reference to the lid 13 in FIG. 1. However, the lid 13B includes a plurality of trenches T in contact with the thermal conductive bonding layer 12. In some embodiments, the plurality of trenches T are located on the bottom surface S130B of the plate portion 130B and overlapped with the semiconductor package 11 in the normal direction D3 of the substrate 10. In some embodiments, the space enclosed by the plurality of trenches T, the bottom surface S130B of the plate portion 130B, the backside metal layer 15, and the bonding layer 18 are fully filled by the thermal conductive bonding layer 12.

Figure 28A:
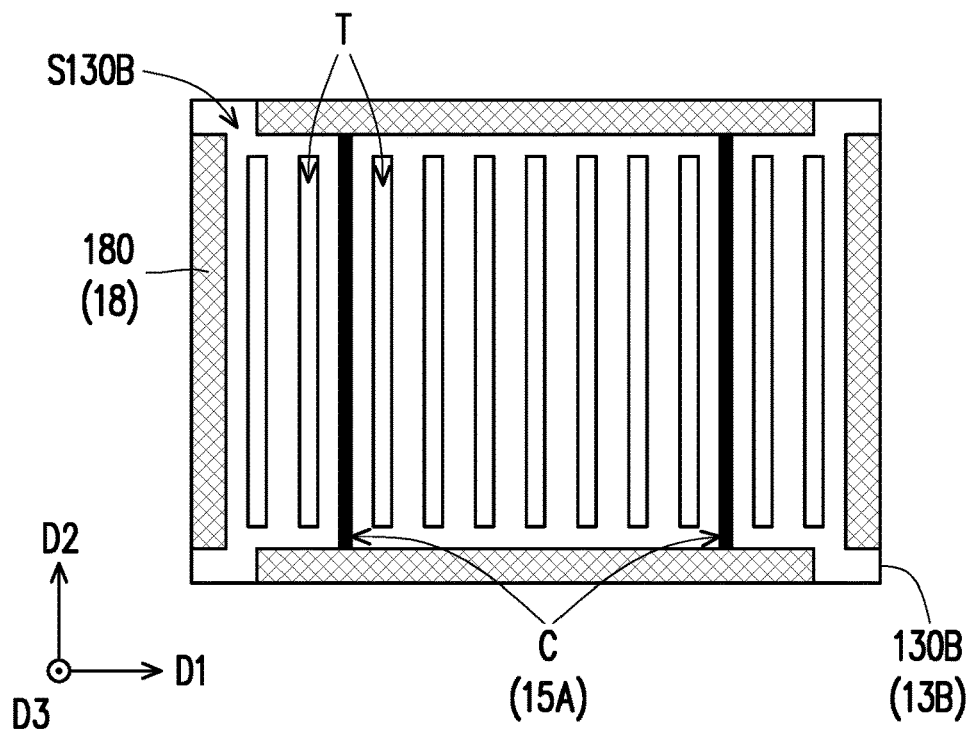
FIG. 28A through FIG. 28F are front views schematically illustrating structures on bottom surfaces of plate portions of lids according to some embodiments of the present disclosure.
Figure 28B:
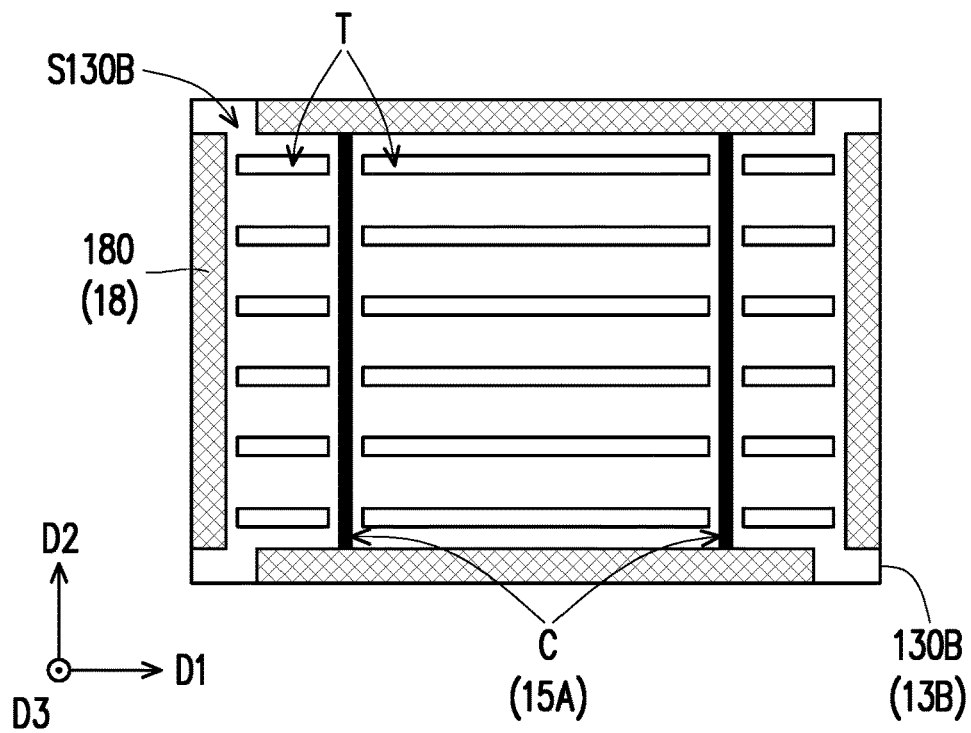
Figure 28C:
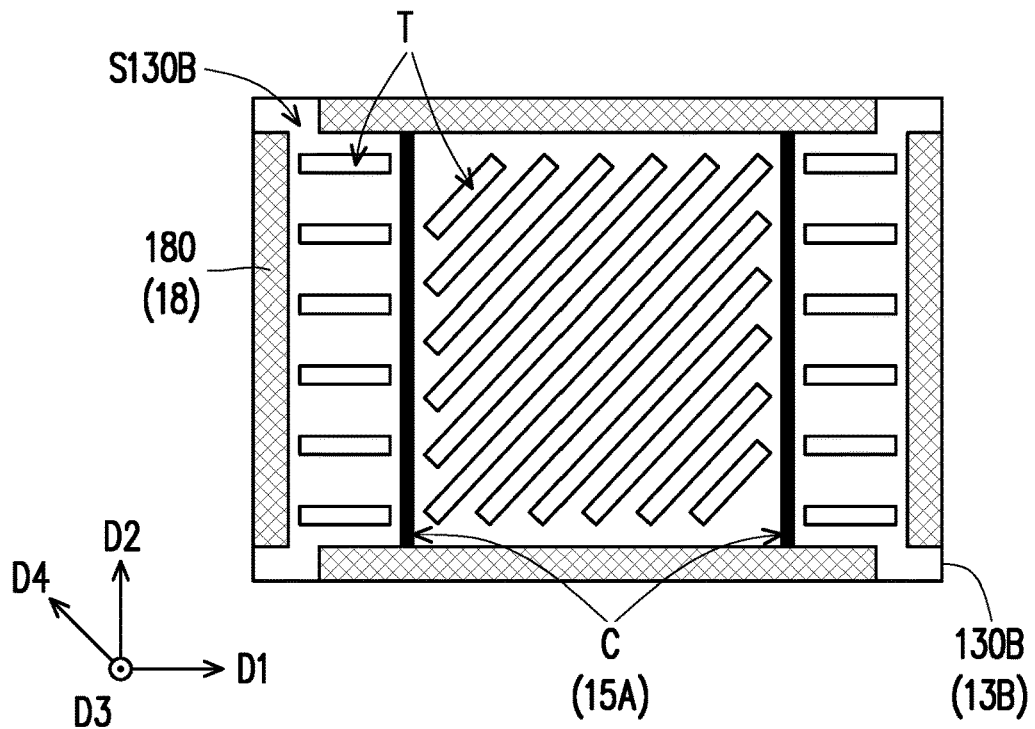

Each of FIG. 28A through FIG. 28C schematically illustrates the plurality of trenches T on the bottom surface S130B of the plate portion 130B of the lid 13B. As shown in FIG. 28A, the plurality of trenches T may be arranged in the first direction D1, and each of the plurality of trenches T may extend in the second direction D2. The plurality of trenches T may have the same width in the first direction D1, and the plurality of trenches T may have the same length in the second direction D2. As shown in FIG. 28B, the plurality of trenches T may be arranged in the second direction D2, and each of the plurality of trenches T may extend in the first direction D1. The plurality of trenches T may have the same width in the second direction D2, and the plurality of trenches T in the middle may be longer than the plurality of trenches T at the edges. As shown in FIG. 28C, the plurality of trenches T in the middle may be arranged in a direction D4 that is neither parallel nor perpendicular to the first direction D1 and the second direction D2, while the plurality of trenches T at the edges may be arranged in the second direction D2. The plurality of trenches T in the middle and at the edges may have the same width, and at least a portion of the plurality of trenches T in the middle may be longer than the plurality of trenches T at the edges. However, sizes (e.g., widths, lengths, or depths), pitches, shapes, arrangement direction or extending directions of the plurality of trenches T may be changed according to design requirement. For example, the shapes of the plurality of trenches T may include circles, ellipses, squares, rectangles, rings, other polygons, or a combination thereof. The semiconductor device of any of the embodiments in the disclosure can be improved as described above, and will not be described again below.

Figure 4:
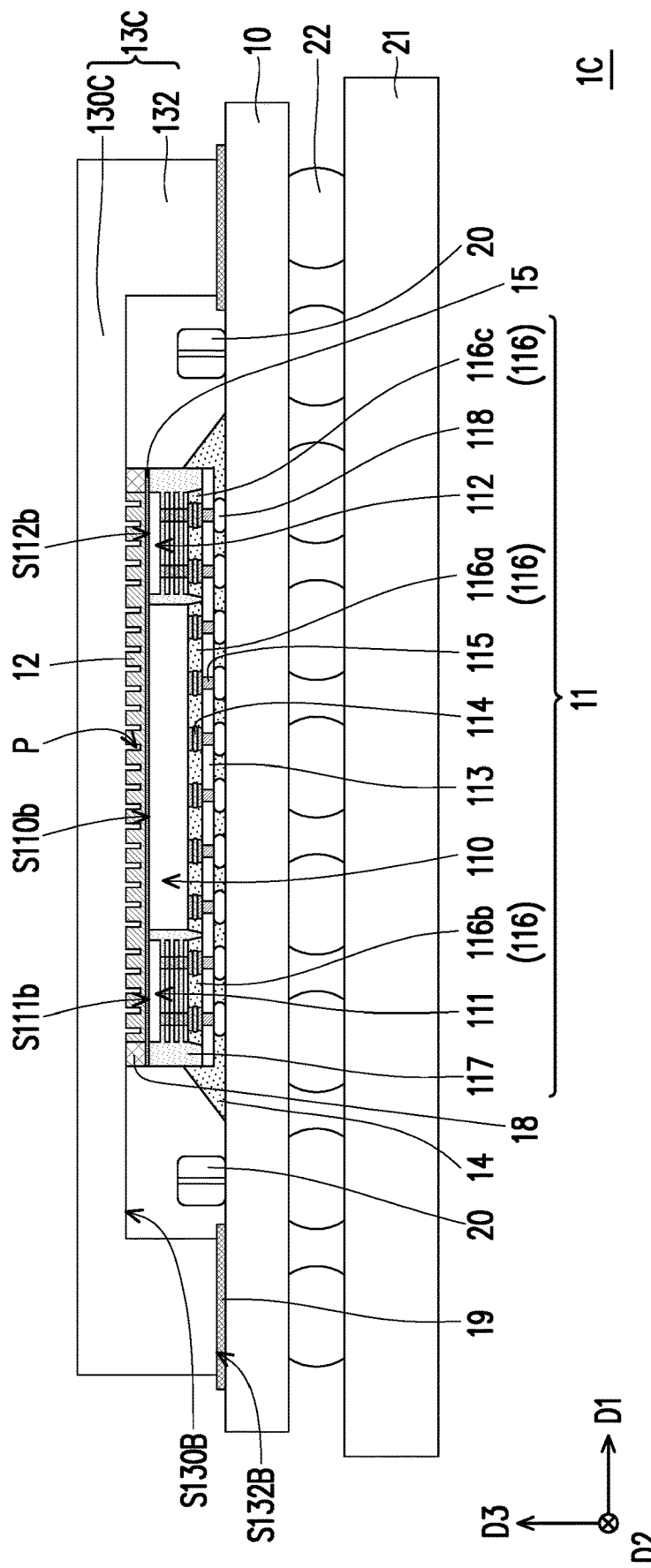

Referring to FIG. 4, a semiconductor device 1C may include a lid 13C in addition to the substrate 10, the semiconductor package 11, the thermal conductive bonding layer 12, the underfill 14, the backside metal layer 15, the bonding layer 18, the bonding layer 19, the plurality of passive components 20, the printed circuit board 21, and the connectors 22 described above.

The lid 13C is similar to those previously discussed with reference to the lid 13 in FIG. 1. However, the lid 13C includes a plurality of pillars P in contact with the thermal conductive bonding layer 12. In some embodiments, the plurality of pillars P are connected to the bottom surface S130B of the plate portion 130C and overlapped with the semiconductor package 11 in the normal direction D3 of the substrate 10. In some embodiments, the plurality of pillars P are formed on the bottom surface S130B of the plate portion 130C through a placement process, a milling machining process or an etching process. In some embodiments, the plurality of pillars P, the plate portion 130C and the frame portion 132 are integrally formed. In some embodiments, the plurality of pillars P are spaced apart from the backside metal layer 15. In some embodiments, the space enclosed by the plurality of pillars P, the bottom surface S130B of the plate portion 130C, the backside metal layer 15, and the bonding layer 18 are fully filled by the thermal conductive bonding layer 12.

Figure 28D:
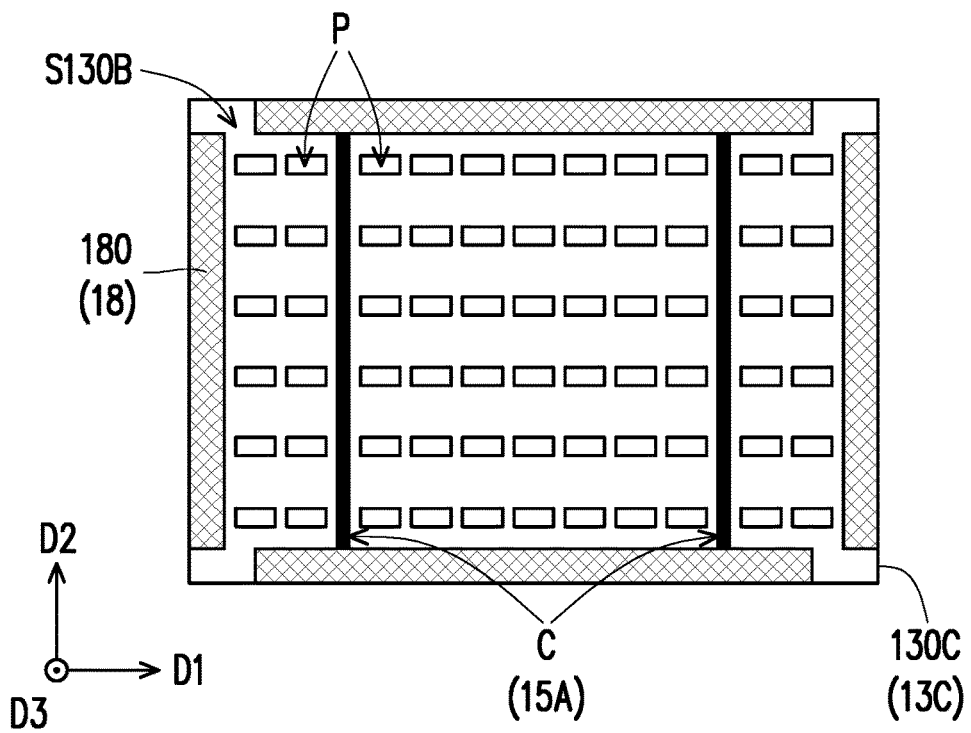
Figure 28E:
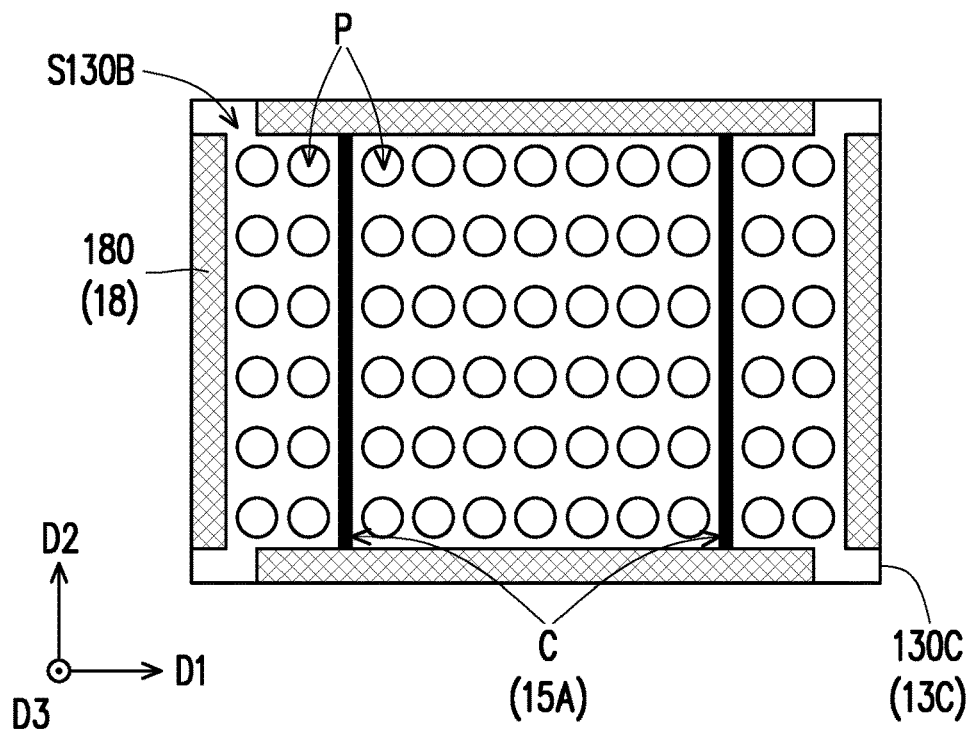
Figure 28F:
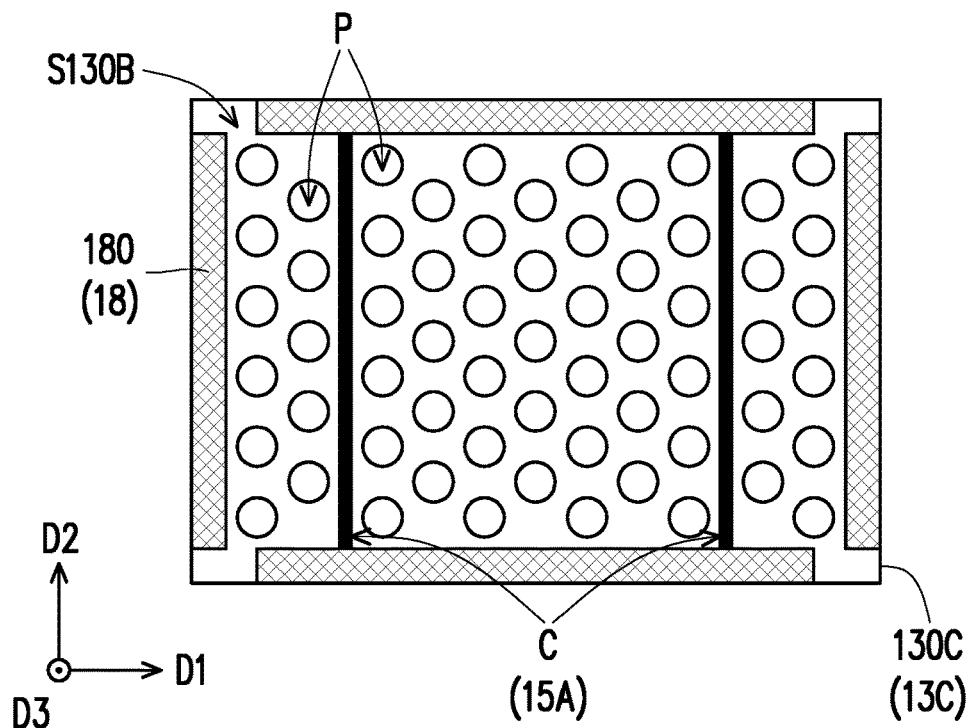

Each of FIG. 28D through FIG. 28F schematically illustrates the plurality of pillars P on the bottom surface S130B of the plate portion 130C of the lid 13C. As shown in FIG. 28D, the shapes of the plurality of pillars P may include rectangles, and the plurality of pillars P may be arranged in both first direction D1 and second direction D2. As shown in FIG. 28E, the shapes of the plurality of pillars P may include circles, and the plurality of pillars P may be arranged in both first direction D1 and second direction D2. As shown in FIG. 28F, the shapes of the plurality of pillars P may include circles, and the plurality of pillars P may be arranged in the second direction D2 and dislocated in the first direction D. However, sizes (e.g., widths, lengths, or heights), pitches, shapes, arrangement direction or extending directions of the plurality of pillars P may be changed according to design requirement. In some alternative embodiments, the shapes of the plurality of pillars P include circles, ellipses, squares, rectangles, rings, other polygons, or a combination thereof. The semiconductor device of any of the embodiments in the disclosure can be improved as described above, and will not be described again below.

For illustration purposes, each of FIG. 28A through FIG. 28F also illustrates the bonding layer 18 and the plurality of cavities C of the backside metal layer 15A. In some embodiments, the bonding layer 18 includes a plurality of patterns 180 disposed around the plurality of trenches T or the plurality of pillars P. In some embodiments, the plurality of trenches T or the plurality of pillars P are surrounded by the plurality of patterns 180. In other words, the plurality of trenches T or the plurality of pillars P are located between the plurality of patterns 180 of the bonding layer 18. Each of the plurality of patterns 180 may be a stripe that extends in the first direction D1 or the second direction D2. In some alternative embodiments, the shapes of the plurality of patterns 180 may include circles, ellipses, squares, rings, other polygons, or a combination thereof. In some alternative embodiments, the bonding layer 18 includes a ring-shaped pattern (not shown) surrounding the plurality of trenches T or the plurality of pillars P. Each of the plurality of cavities C of the backside metal layer 15A may extend in the second direction D2, for example. The semiconductor device of any of the embodiments in the disclosure can be improved as described above, and will not be described again below.

Figure 5:
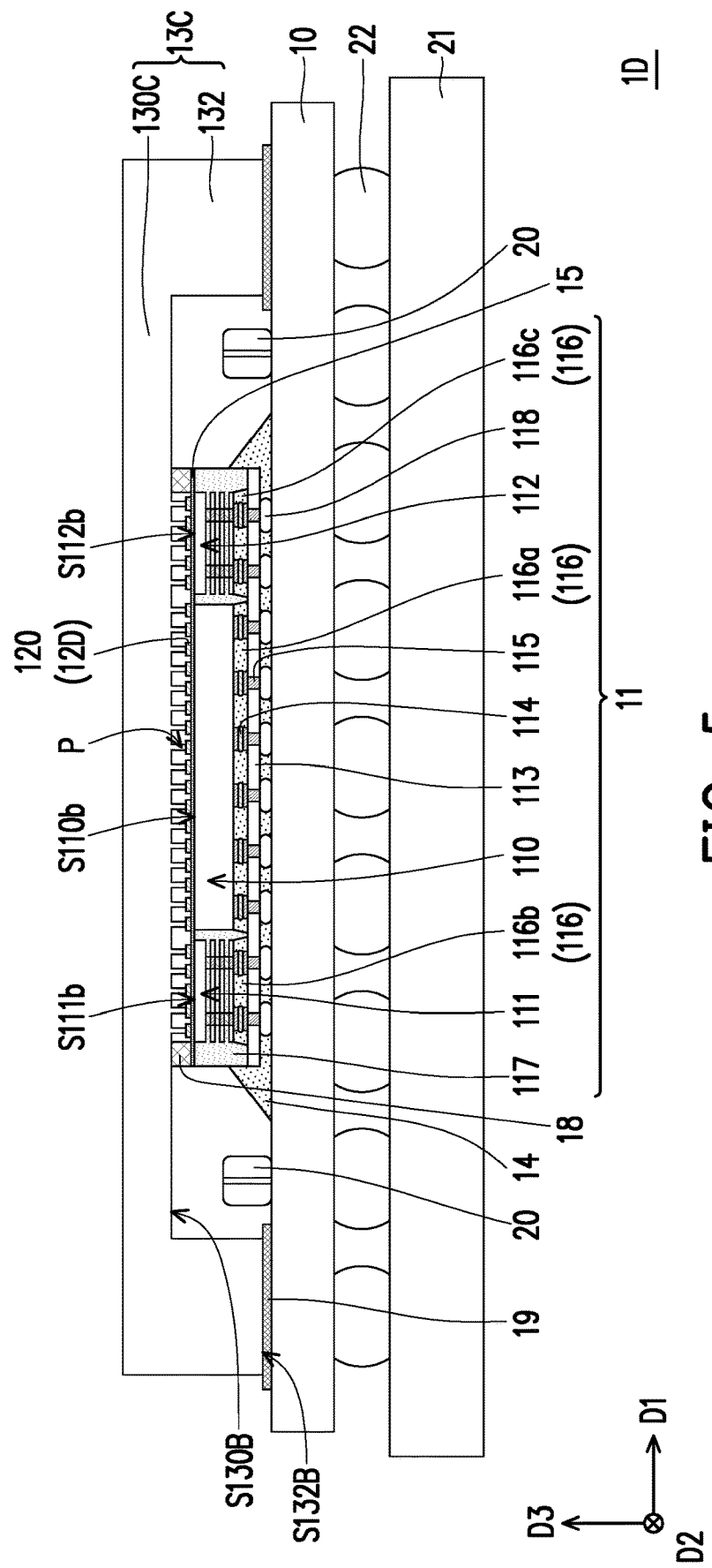

Referring to FIG. 5, a semiconductor device 1D may include a thermal conductive bonding layer 12D in addition to the substrate 10, the semiconductor package 11, the lid 13C, the underfill 14, the backside metal layer 15, the bonding layer 18, the bonding layer 19, the plurality of passive components 20, the printed circuit board 21, and the connectors 22 described above.

The thermal conductive bonding layer 12D is similar to those previously discussed with reference to the thermal conductive bonding layer 12 in FIG. 1. However, the thermal conductive bonding layer 12D includes a plurality of bonding patterns 120 connected between the plurality of pillars P and the backside metal layer 15. In some embodiments, the bottom surface S130B of the plate portion 130C of the lid 13C is spaced apart from the thermal conductive bonding layer 12D via the plurality of pillars P, namely, a gap (e.g., an air gap) exists between the bottom surface S130B of the plate portion 130C and the backside metal layer 15.

Figure 6:
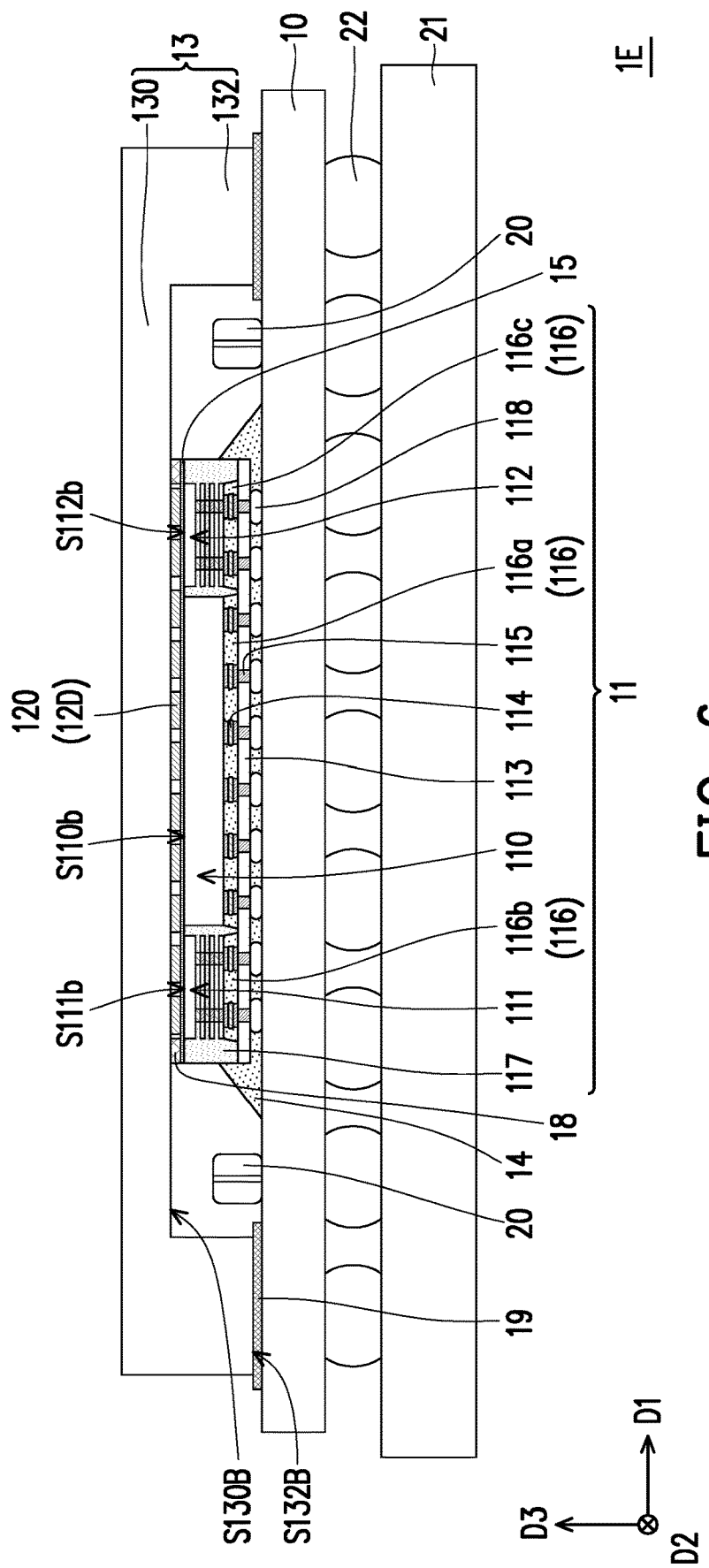

Referring to FIG. 6, a semiconductor device 1E may include the substrate 10, the semiconductor package 11, the thermal conductive bonding layer 12D, the lid 13, the underfill 14, the backside metal layer 15, the bonding layer 18, the bonding layer 19, the plurality of passive components 20, the printed circuit board 21 and the connectors 22 described above.

The semiconductor device 1E is similar to those previously discussed with reference to the semiconductor device 1D in FIG. 5. However, in the semiconductor device 1E, the plurality of pillars P are omitted, and the plurality of bonding patterns 120 of the thermal conductive bonding layer 12D are connected between the bottom surface S130B and the backside metal layer 15. In some embodiments, the bottom surface S130B of the plate portion 130 is spaced apart from the backside metal layer 15 via the thermal conductive bonding layer 12D and the bonding layer 18, namely, a gap (e.g., an air gap) may exist between the bottom surface S130B of the plate portion 130 and the backside metal layer 15. In some alternative embodiments, the thermal conductive bonding layer 12D (a patterned layer) may be replaced by the thermal conductive bonding layer 12 (a continuous layer) as shown in FIG. 1.

Figure 7:
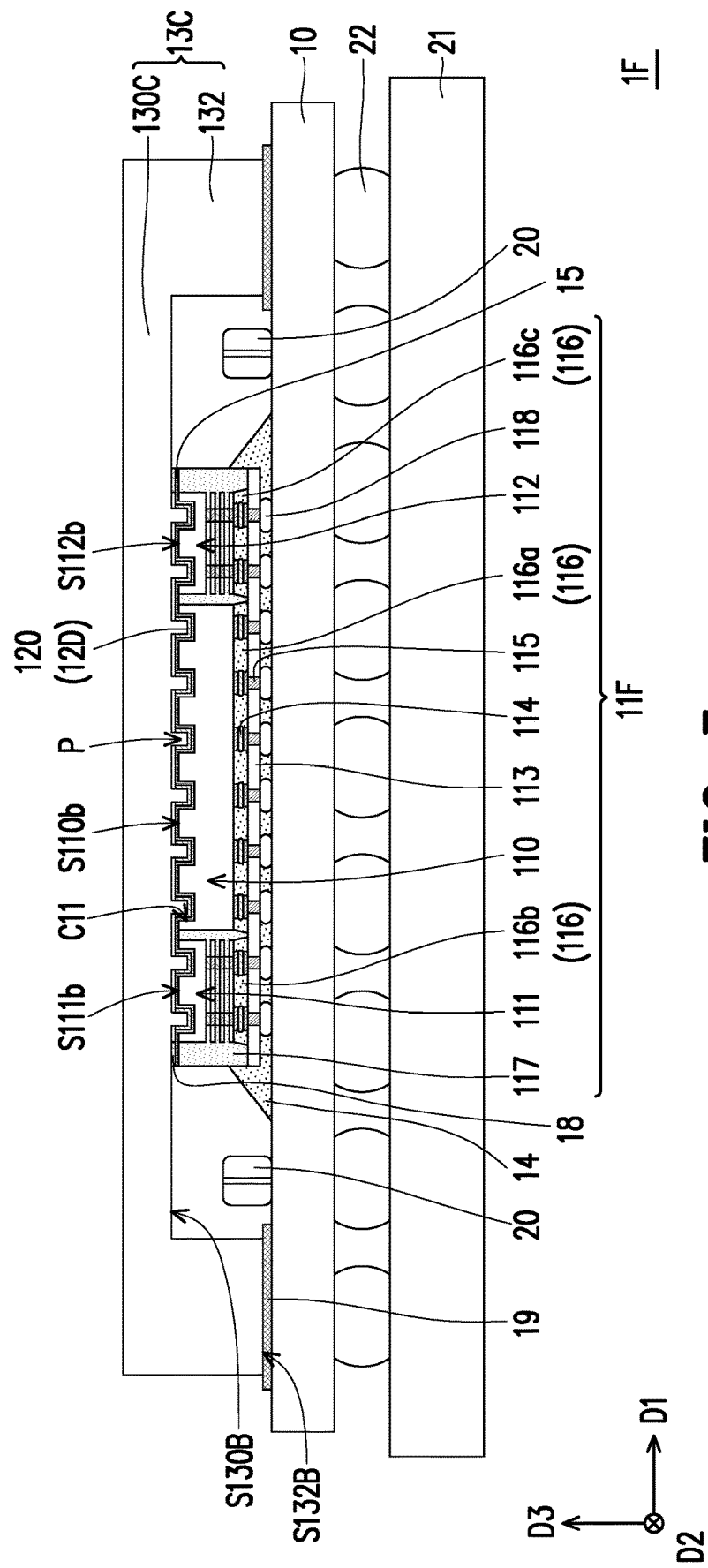

Referring to FIG. 7, a semiconductor device 1F may include a semiconductor package 11F in addition to the substrate 10, the thermal conductive bonding layer 12D, the lid 13C, the underfill 14, the backside metal layer 15, the bonding layer 18, the bonding layer 19, the plurality of passive components 20, the printed circuit board 21, and the connectors 22 described above.

The semiconductor package 11F is similar to those previously discussed with reference to the semiconductor package 11 in FIG. 1. However, the semiconductor package 11F has a plurality of cavities C11 on the backside surface (including the backside surfaces S110b, S111b and S112b of the semiconductor dies 110, 111 and 112) of the semiconductor package 11F. In some embodiments, the plurality of cavities C11 are on the backside surfaces S110b, S111b and S112b of the semiconductor dies 110, 111 and 112. In other words, the plurality of cavities C11 are overlapped with one of the semiconductor dies 110, 111 and 112 in the normal direction D3 of the substrate 10.

In some embodiments, the backside metal layer 15 is disposed on the backside surface (including the backside surfaces S110b, S111b and S112b of the semiconductor dies 110, 111 and 112) of the semiconductor package 11F and located in the plurality of cavities C11. The plurality of bonding patterns 120 of the thermal conductive bonding layer 12D may be located in a portion of the plurality of cavities C11, and the plurality of pillars P are inserted into the portion of the plurality of cavities C11 and are in contact with the plurality of bonding patterns 120. In some embodiments, each of the plurality of cavities C11 is disposed with a corresponding bonding pattern 120. The corresponding bonding pattern 120 may be disposed on the backside metal layer 15 located on the side surface and bottom surface of the cavity C11, and the corresponding bonding pattern 120 may be connected to a corresponding pillar P. In some embodiments, the bottom surface S130B of the plate portion 130C is spaced apart from the backside metal layer 15, namely, a gap (e.g., an air gap) exists between the bottom surface S130B of the plate portion 130C and the backside metal layer 15.

Figure 8:
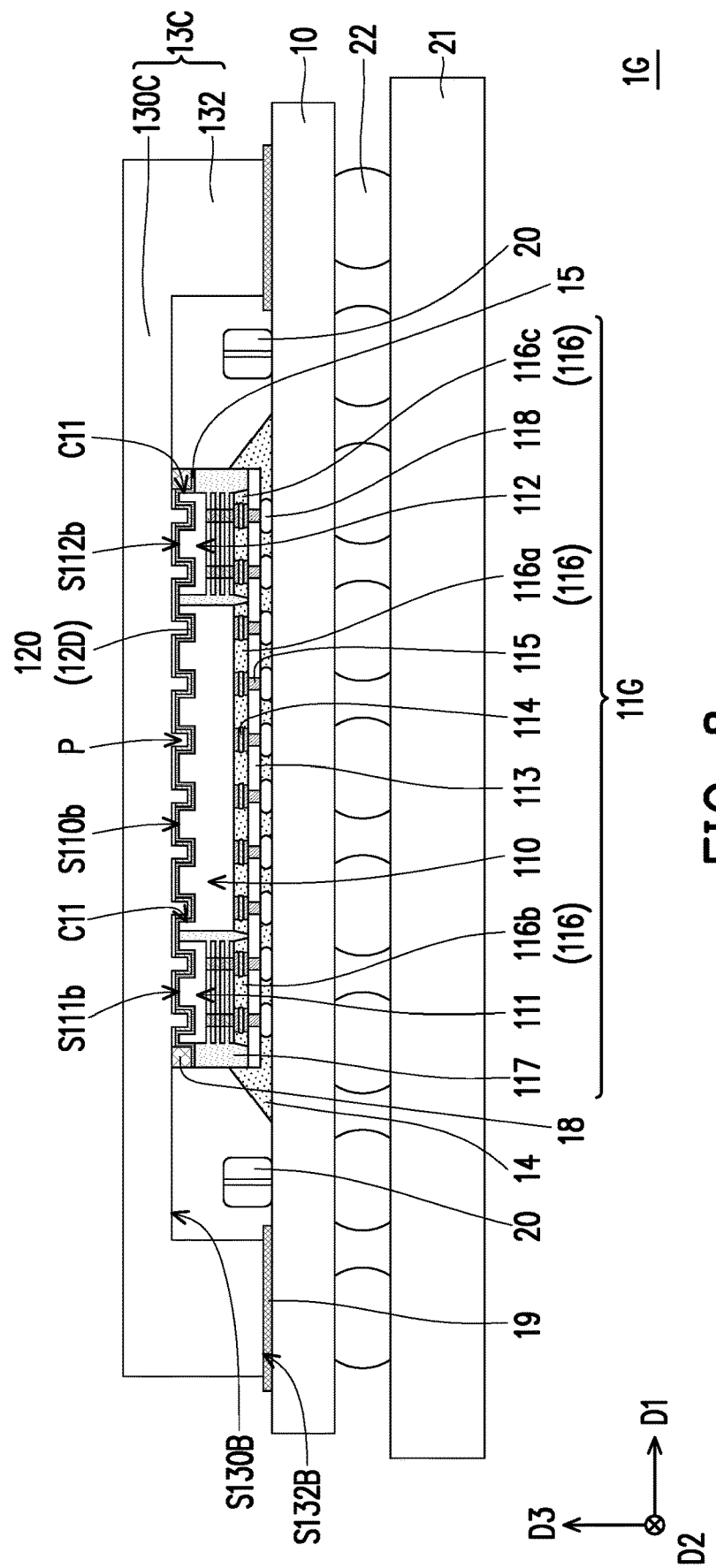

Referring to FIG. 8, a semiconductor device 1G may include a semiconductor package 11G in addition to the substrate 10, the thermal conductive bonding layer 12D, the lid 13C, the underfill 14, the backside metal layer 15, the bonding layer 18, the bonding layer 19, the plurality of passive components 20, the printed circuit board 21 and the connectors 22 described above.

The semiconductor package 11G is similar to those previously discussed with reference to the semiconductor package 11F in FIG. 7. However, in the semiconductor package 11G, the plurality of cavities C11 are further located on the encapsulant 117 of the semiconductor package 11G. In some embodiments, the cavities C11 on the encapsulant 117 are the outermost cavities among the plurality of cavities C11, and the bonding layer 18 may be located in the outermost cavities.

Figure 9:
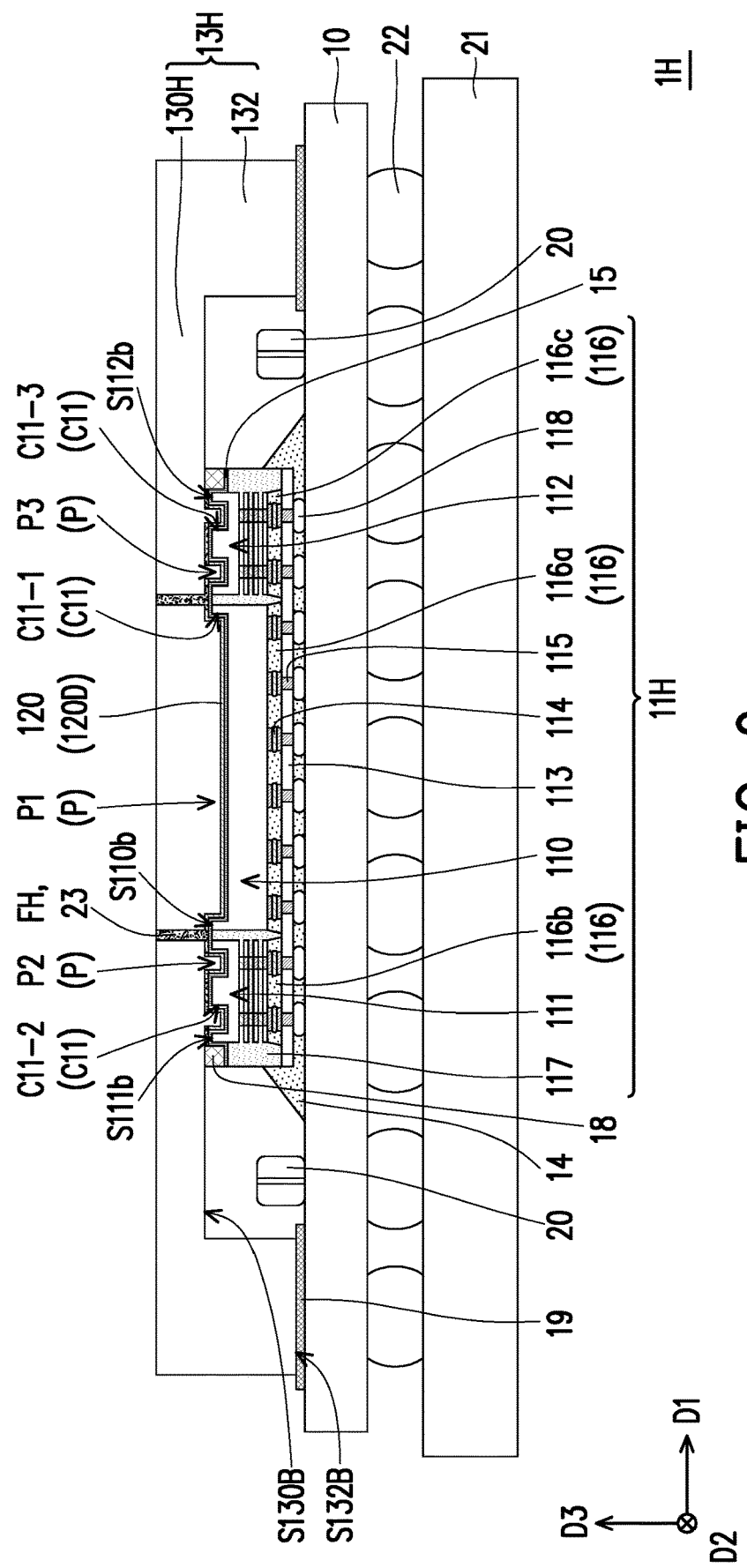

Referring to FIG. 9, a semiconductor device 1H may include a semiconductor package 11H, a lid 13H and a filling material layer 23 in addition to the substrate 10, the thermal conductive bonding layer 12D, the underfill 14, the backside metal layer 15, the bonding layer 18, the bonding layer 19, the plurality of passive components 20, the printed circuit board 21, and the connectors 22 described above.

The semiconductor package 11H and the lid 13H are similar to those previously discussed with reference to the semiconductor package 11G and the lid 13C in FIG. 8. However, in the semiconductor package 11H, a cavity C11 (e.g., cavity C11-1) on the backside surface S110b among the plurality of cavities C11 has a width (e.g., a width in the first direction D1) larger than that of a cavity C11 (e.g., cavity C11-2) on the backside surface S111b among the plurality of cavities C11 and that of a cavity C11 (e.g., cavity C11-3) on the backside surface S112b among the plurality of cavities C11. In the lid 13H, a pillar P (e.g., pillar P1) extending into the cavity C11-1 among the plurality of pillars P has a width (e.g., a width in the first direction D1) larger than that of a pillar P (e.g., pillar P2) extending into the cavity C11-2 among the plurality of pillars P and that of a pillar P (e.g., pillar P3) extending into the cavity C11-3 among the plurality of pillars P. In some alternative embodiments, the design parameters (e.g., the number, width, length, depth, or height, etc.) of each of the cavity C11-1, the cavity C11-2, the cavity C11-3, the pillar P1, the pillar P2 and the pillar P3 may be changed according to design requirements. The semiconductor device of any of the embodiments in the disclosure can be improved as described above, and will not be described again below.

In the semiconductor device 1H, the lid 13H has a plurality of filling holes FH connected to a gap located between the lid 13H and the semiconductor package 11H, and the filling material layer 23 is filled in the gap and the plurality of filling holes FH to improve structural strength. In some embodiments, the filling material layer 23 may include a thermally conductive underfill material to further improve thermal conductivity. The semiconductor device of any of the embodiments in the disclosure can be improved as described above. For example, any of the semiconductor device 1D in FIG. 5, the semiconductor device 1E in FIG. 6, the semiconductor device 1F in FIG. 7, and the semiconductor device 1G in FIG. 8 or any of the following embodiments can be improved as described above, and will not be described again below.

Figure 10:
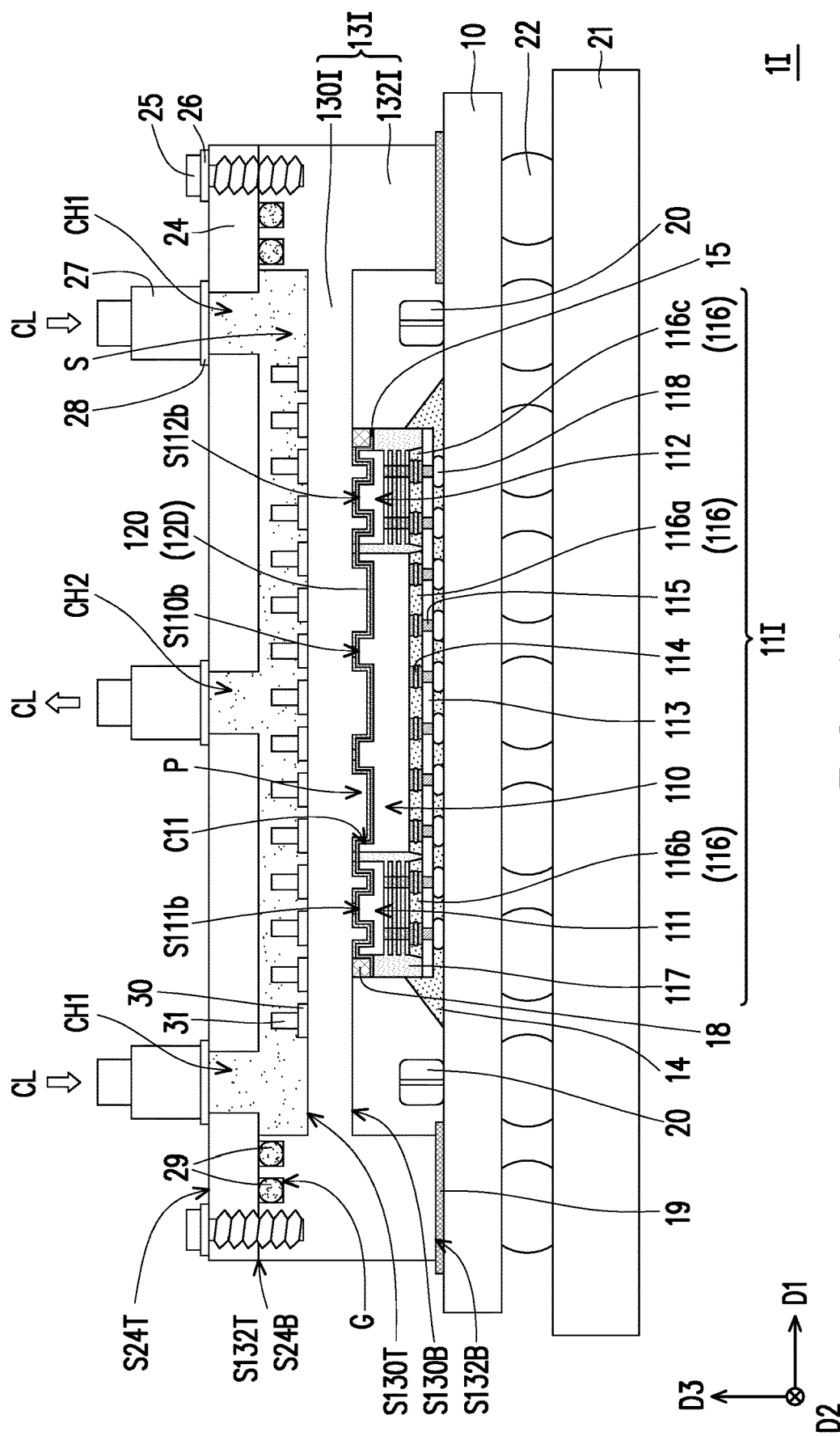

Referring to FIG. 10, a semiconductor device 1I may include a semiconductor package 11I, a lid 13I, a cover 24, screws 25, washers 26, pipes 27, washers 28, O shaped seal rings (also referred to as O-rings) 29, a plurality of bonding patterns 30, and a plurality of pillars 31 in addition to the substrate 10, the thermal conductive bonding layer 12D, the underfill 14, the backside metal layer 15, the bonding layer 18, the bonding layer 19, the plurality of passive components 20, the printed circuit board 21 and the connectors 22 described above.

The semiconductor device 1I and the lid 13I are similar to those previously discussed with reference to the semiconductor device 11H and the lid 13H in FIG. 9. However, the top surface S130T of a plate portion 130I of the lid 13I is lower than the top surface S132T of a frame portion 132I of the lid 13I. The design of the plurality of cavities C11 on the backside surface of the semiconductor package 11I, the bonding layer 18, and the plurality of pillars P connected to the bottom surface S130B of the plate portion 130I of the lid 13I may be similar to those previously discussed with reference to FIG. 9, and will not be repeated here.

The cover 24 is disposed on the lid 13I. A material of the cover 24 may be similar to those previously discussed with reference to the lid 13 in FIG. 1, and will not be repeated here. In some embodiments, the cover 24 is connected to the top surface S132T of the frame portion 132I. In some embodiments, the cover 24 is fixed on the frame portion 132I via the screws 25, the washers 26 and the O shaped seal rings 29. In some alternative embodiments, the cover 24 and the lid 13I are fixed together through screws, welding, buckles, a seal ring or a combination thereof. In some embodiments, the screws 25 are screwed to the frame portion 132I, and the screws 25 are secured by the washers 26 on the cover 24. The O shaped seal ring 29 provides closure and segregation for avoiding fluid leakage. In some embodiments, the O shaped seal ring 29 is made of a polymeric material, such as an organic resin or rubber. In some embodiments, the O shaped seal ring 29 includes a silicone filling. In some embodiments, the O shaped seal rings 29 are located between the frame portion 132I and the cover 24 and between the plate portion 130I of the lid 13I and the screws 25. In some embodiments, the top surface S132T of the frame portion 132I has ring shaped grooves G to secure the O shaped seal rings 29. In some alternative embodiments, the bottom surface S24B of the cover 24 has ring shaped grooves (not shown) to secure the O shaped seal rings 29.

The plurality of pillars 31 are disposed over the semiconductor package 22I and located between the lid 13I and the cover 24. In some embodiments, the plurality of pillars 31 are disposed on the top surface S130T of the plate portion 130I, and the plurality of pillars 31 are spaced apart from the cover 24. A method of forming the plurality of pillars 31 and a material of the plurality of pillars 31 may be similar to those previously discussed with reference to the plurality of pillars 17 in FIG. 1, and will not be repeated here.

The plurality of bonding patterns 30 are disposed between the lid 13I and the plurality of pillars 31. A method of forming the plurality of bonding patterns 30 and a material of the plurality of bonding patterns 30 may be similar to those previously discussed with reference to the plurality of bonding patterns 16 in FIG. 1, and will not be repeated here.

In some alternative embodiments, the plurality of bonding patterns 30 are omitted, and the plurality of pillars 31 are connected to the top surface S130T of the plate portion 130I. In those alternative embodiments, the plurality of pillars 31 may be formed on the top surface S130T of the plate portion 130I through a placement process, a milling machining process, or an etching process.

Figure 29A:
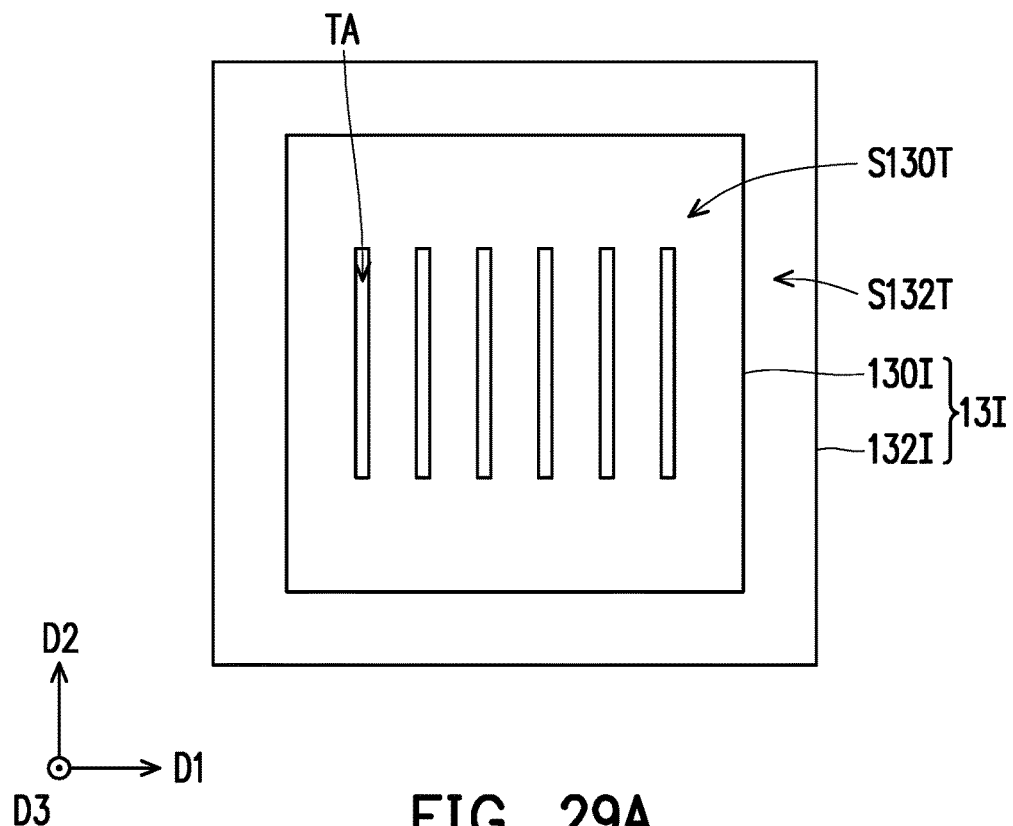
FIG. 29A through FIG. 29E are front views schematically illustrating structures on top surfaces of plate portions of lids according to some embodiments of the present disclosure.
Figure 29B:
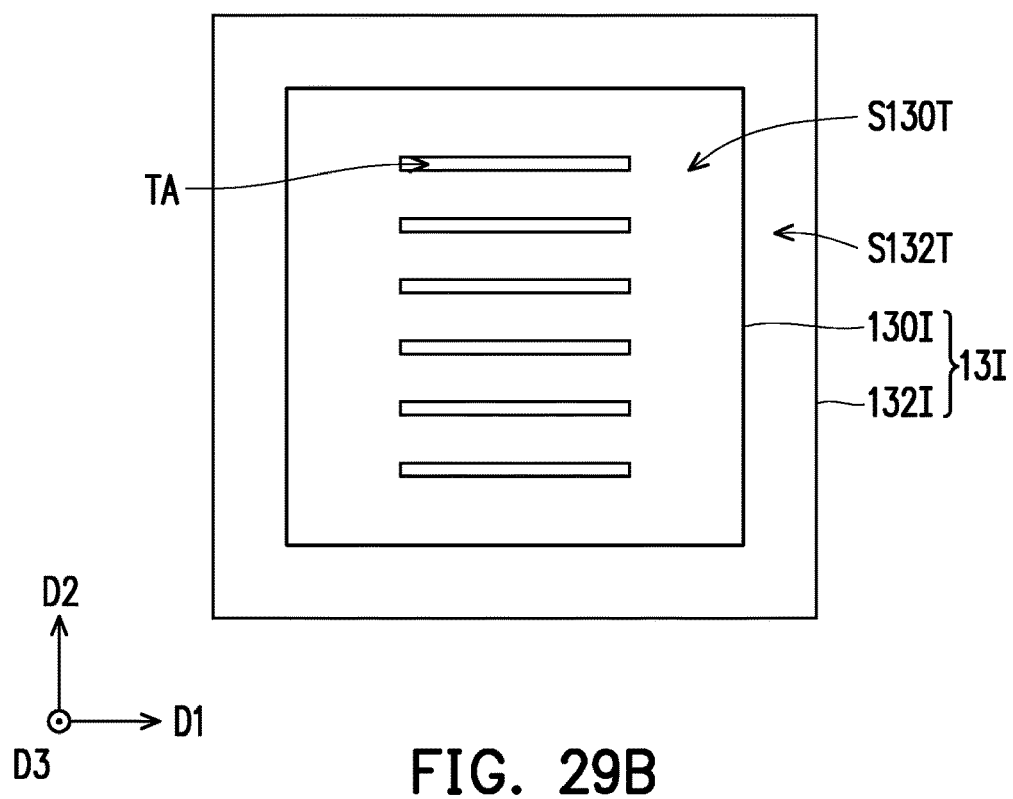
Figure 29C:
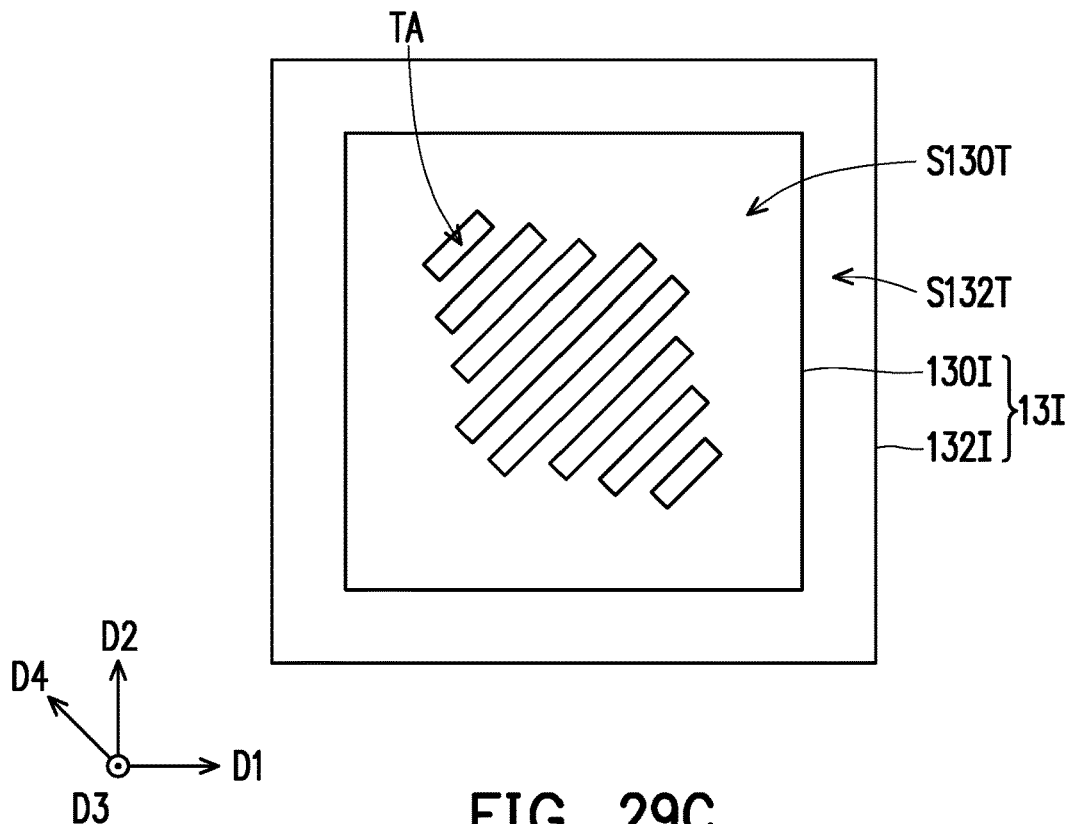
Figure 29D:
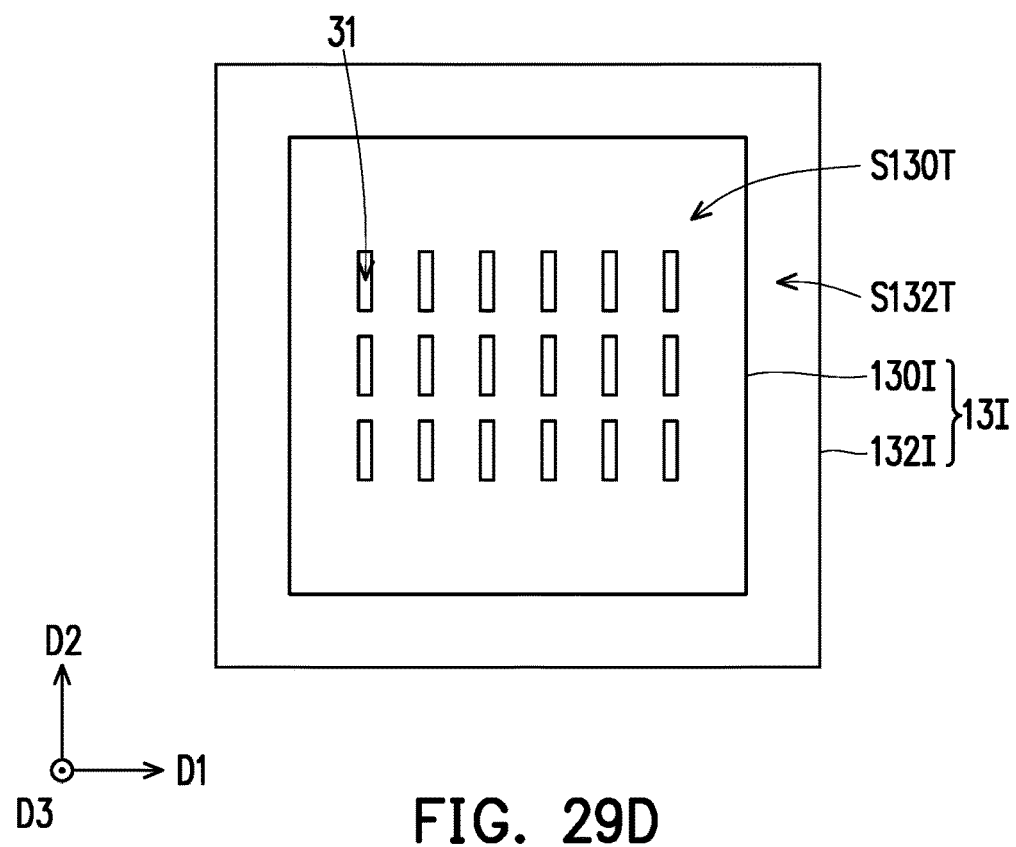
Figure 29E:
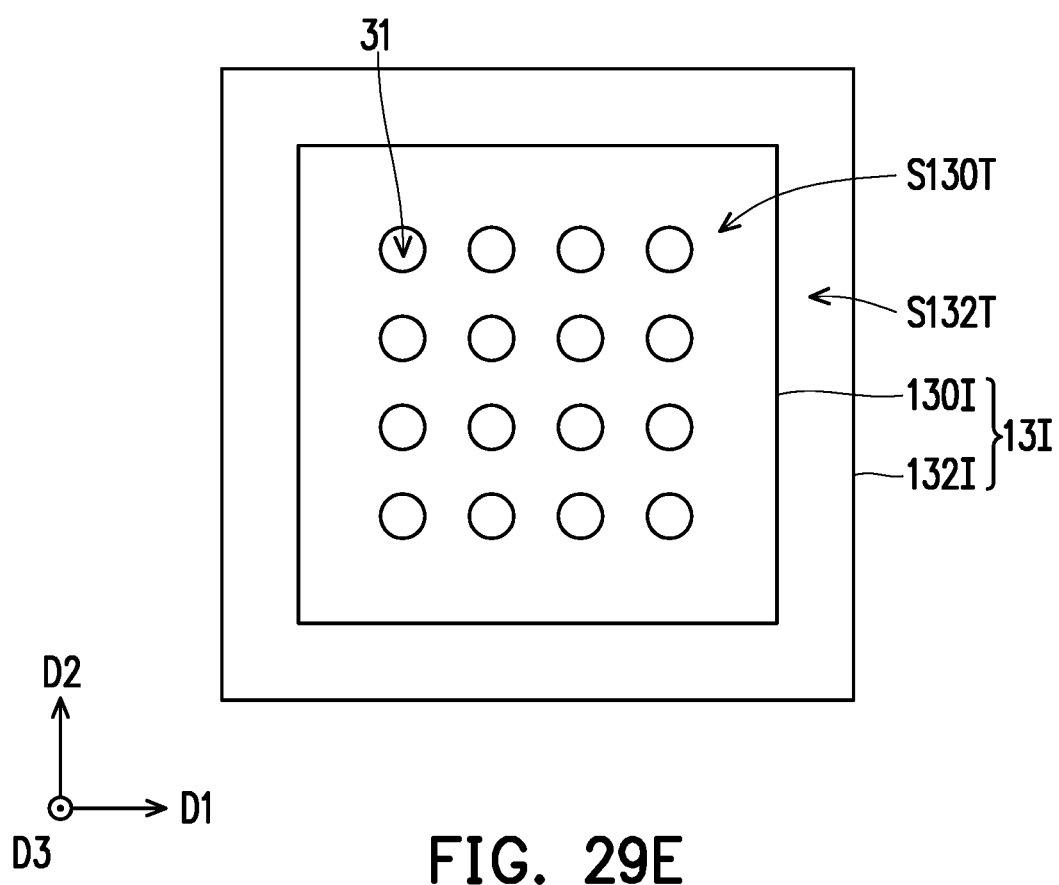

Each of FIG. 29D and FIG. 29E schematically illustrates the plurality of pillars 31 connected to the top surface S130T of the plate portion 130I of the lid 13I. As shown in FIG. 29D, the shapes of the plurality of pillars 31 may include rectangles, and the plurality of pillars 31 may be arranged in both first direction D1 and second direction D2. As shown in FIG. 29E, the shapes of the plurality of pillars 31 may include circles, and the plurality of pillars 31 may be arranged in both first direction D1 and second direction D2. However, sizes (e.g., widths, lengths, or heights), pitches, shapes, arrangement direction or extending directions of the plurality of pillars 31 may be changed according to design requirement. In some alternative embodiments, the plurality of pillars 31 may be arranged in the second direction D2 and dislocated in the first direction D1. In some alternative embodiments, the shapes of the plurality of pillars 31 include circles, ellipses, squares, rectangles, rings, other polygons, or a combination thereof. The semiconductor device of any of the embodiments in the disclosure can be improved as described above, and will not be described again below.

Referring back to FIG. 10, in some alternative embodiments, the plurality of bonding patterns 30 and the plurality of pillars 31 are omitted, and a plurality of trenches TA (not shown in FIG. 10, shown in FIG. 29A through FIG. 29C) may be formed on the top surface S130T of the plate portion 130I through a milling machining process, or an etching process.

Each of FIG. 29A through FIG. 29C schematically illustrates the plurality of trenches TA on the top surface S130T of the plate portion 130I of the lid 13I. As shown in FIG. 29A, the plurality of trenches TA may be arranged in the first direction D1, and each of the plurality of trenches T may extend in the second direction D2. The plurality of trenches T may have the same width in the first direction D1, and the plurality of trenches T may have the same length in the second direction D2. As shown in FIG. 29B, the plurality of trenches TA may be arranged in the second direction D2, and each of the plurality of trenches TA may extend in the first direction D1. The plurality of trenches TA may have the same width in the second direction D2, and the plurality of trenches T may have the same length in the first direction D1. As shown in FIG. 29C, the plurality of trenches TA may be arranged in the direction D4 that is neither parallel nor perpendicular to the first direction D1 and the second direction D2. The plurality of trenches TA may have the same width, the plurality of trenches TA in the middle may be longer than the plurality of trenches TA at the edges. However, sizes (e.g., widths, lengths, or depths), pitches, shapes, arrangement direction or extending directions of the plurality of trenches TA may be changed according to design requirement. For example, the shapes of the plurality of trenches TA may include circles, ellipses, squares, rectangles, rings, other polygons, or a combination thereof. The semiconductor device of any of the embodiments in the disclosure can be improved as described above, and will not be described again below.

Referring back to FIG. 10, the cover 24 may include at least one inflow channel CH1 (e.g., two inflow channels CH1) and at least one outflow channel CH2 to allow the coolant CL to flow into and out of a space S between the lid 13I and the cover 24. The coolant CL flows into the space S through the inflow channels CH1 and carries away the heat transmitted to the plurality of pillars 31 through heat conduction. The coolant CL flowing between the plurality of pillars 31 takes away the heat of the plurality of pillars 31 and causes its temperature to rise. The coolant CL with increased temperature flows upward due to thermal convection and is discharged from the space S through the outflow channel CH2. In some embodiments, the number of the at least one inflow channel is more than one. In some embodiments, the number of the at least one outflow channel is more than one. In some embodiments, at least one of the outflow channels is located adjacent to the center of the lid 13I to prevent heat from accumulating at the center of the semiconductor device 1I. However, the arrangement of the inflow channel(s) and the outflow channel(s) may be changed according to design requirement. In some embodiments, the outflow channel(s) may be at least as large as the inflow channel(s). In some embodiments, the outflow channel(s) may be larger (has a wider opening) than the inflow channel(s). In some embodiments, the coolant CL is a. In some embodiments, the coolant CL is water. In some embodiments, additives are added to the water to produce a cooling fluid. Examples of additives include surfactants, corrosion inhibitors, biocides, antifreeze, and the like. In some embodiments, the space S is located only on the semiconductor package 11I without extended onto the plurality of passive components 20 based on the design requirement.

In some embodiments, the inflow channels CH1 and the outflow channel CH2 may be located over the semiconductor package 11I and overlapped with the semiconductor package 11I in the normal direction D3 of the substrate 10. In some embodiments, at least one of the plurality of pillars 31 is overlapped with the outflow channel CH2 or the inflow channels CH1 in the normal direction D3 of the substrate 10.

In some embodiments, the cover 24 is a plate-like cover that is parallel to the substrate 10. In some embodiments, the inflow channels CH1 and the outflow channel CH2 are through holes of the cover 24. In other words, the depth of each of the inflow channels CH1 and the outflow channel CH2 is equal to the distance between the top surface S24T and the bottom surface S24B of the cover 24.

In some embodiments, the bottom surface S24B of the cover 24 is a flat surface without protrusions, indentations or other structures. In some embodiments, the flat surface (the bottom surface S24B) is spaced apart from the plurality of pillars 31 so that a thickness of the coolant passage between the cover 24 and the plate portion 130I is larger than a sum of thicknesses of each pillar 31 and a corresponding bonding pattern 30. In some alternative embodiments, the thickness of the coolant passage between the cover 24 and the plate portion 130I is equal to a sum of the thicknesses of each pillar 31 and a corresponding bonding pattern 30 so that a first portion of the plurality of pillars 31 (e.g., the pillars 31 overlapped with the bottom surface S24B in the normal direction D3 of the substrate 10) are in contact with the bottom surface S24B and a second portion of the plurality of pillars 31 (e.g., the pillars 31 overlapped with the inflow channels CH1 or the outflow channel CH2 in the normal direction D3 of the substrate 10) are spaced apart from the bottom surface S24B.

By disposing the plurality of pillars 31 closer to the heat sources (e.g., the semiconductor dies 110, 111 and 112) instead of forming the plurality of pillars 31 on the bottom surface S24B of the cover 24, the heat dissipation of the semiconductor device 1I may be improved, the structure design and manufacturing process of the cover 24 can be simplified, and the difficulty of assembly may be reduced. When the flat surface (the bottom surface S24B) is design to be spaced apart from the plurality of pillars 31, the integrity of the plurality of pillars 31 can be maintained during assembly (avoiding deformation of the plurality of pillars 31 by external forces), the flexibility of assembly can be improved, or the influence of the alignment offset on the heat dissipation effect can be reduced.

The pipes 27 are connected to the inflow channels CH1 and the outflow channel CH2 of the cover 24, and the washers 28 secure the attachment of the pipes 27 to the cover 24. In other embodiments, the cover 24 may be fabricated with washer(s) 28 fitted into the inflow channels CH1 and the outflow channel CH2 for subsequent connection with the pipes 27.

Figure 11:
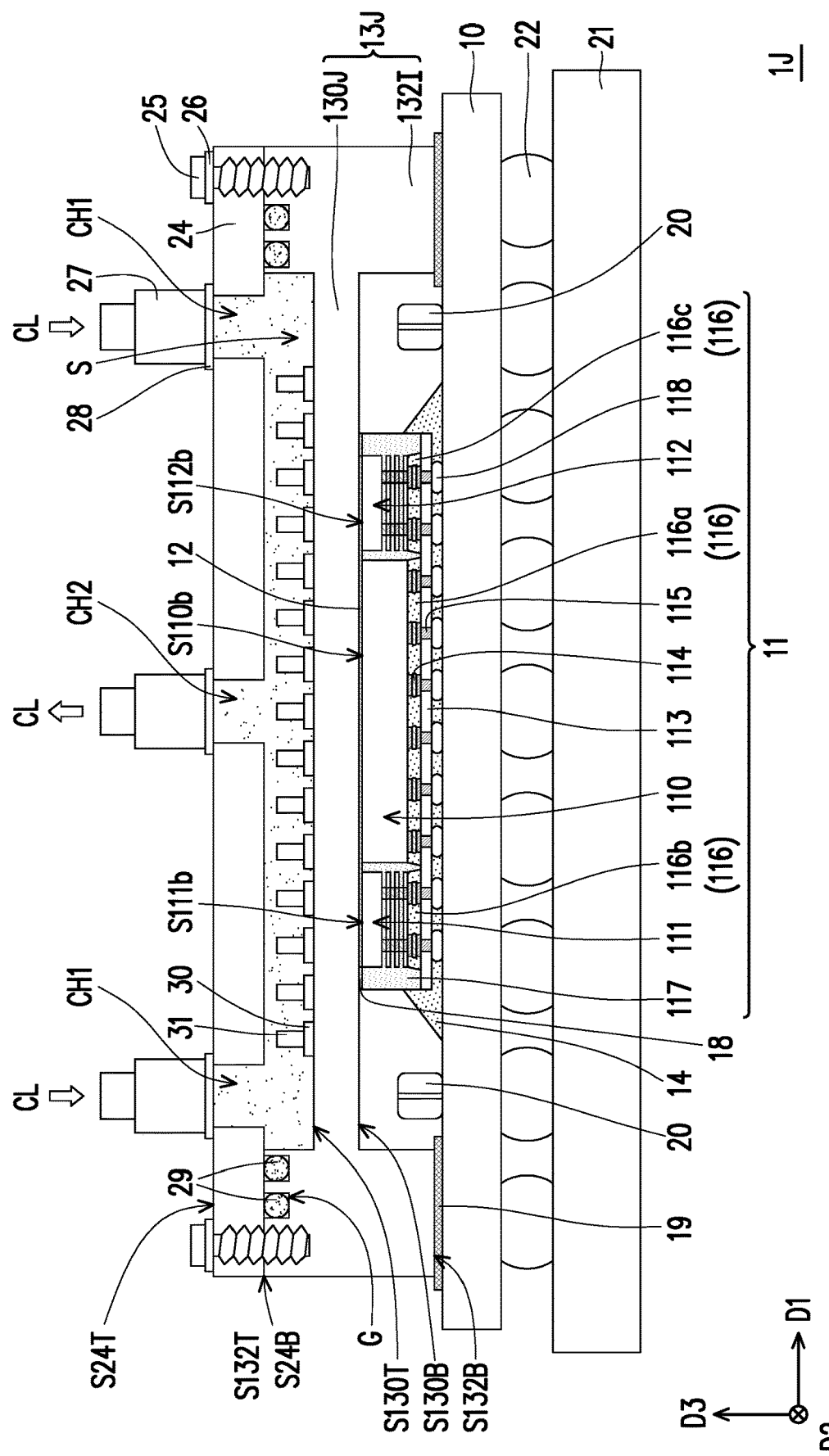

Referring to FIG. 11, a semiconductor device 1J may include a lid 13J in addition to the substrate 10, the semiconductor package 11, the thermal conductive bonding layer 12, the underfill 14, the bonding layer 18, the bonding layer 19, the plurality of passive components 20, the printed circuit board 21, the connectors 22, the cover 24, the screws 25, the washers 26, the pipes 27, the washers 28, the O shaped seal rings 29, the plurality of bonding patterns 30, and the plurality of pillars 31 described above.

The lid 13J is similar to those previously discussed with reference to the lid 13I in FIG. 10. However, the bottom surface S130B of a plate portion 130J of the lid 13I is not disposed with the plurality of pillars Pin FIG. 10, and the bottom surface S130B of the plate portion 130J is connected to the thermal conductive bonding layer 12.

Figure 12:
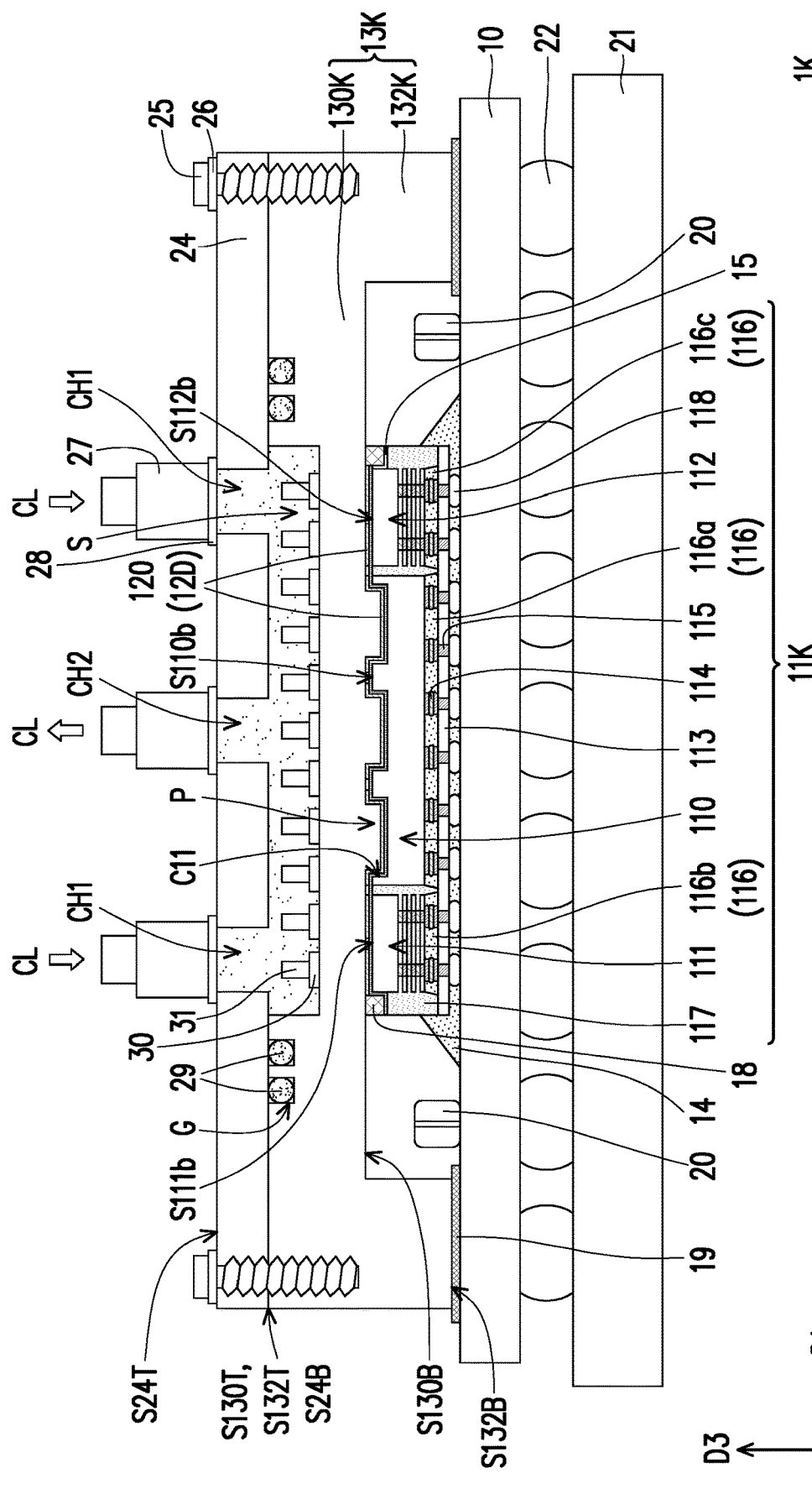

Referring to FIG. 12, a semiconductor device 1K may include a semiconductor package 11K and a lid 13K in addition to the substrate 10, the thermal conductive bonding layer 12, the underfill 14, the backside metal layer 15, the bonding layer 18, the bonding layer 19, the plurality of passive components 20, the printed circuit board 21, the connectors 22, the cover 24, the screws 25, the washers 26, the pipes 27, the washers 28, the O shaped seal rings 29, the plurality of bonding patterns 30, and the plurality of pillars 31 described above.

The semiconductor package 11K and the lid 13K are similar to those previously discussed with reference to the semiconductor package 11I and the lid 13I in FIG. 10. However, the plurality of cavities C11 in the semiconductor package 11K are located on the backside surface S110b of the semiconductor die 110 and not on the backside surface S111b of the semiconductor die 111 and the backside surface S112b of the semiconductor die 112. In other words, the plurality of cavities C11 are not overlapped with the semiconductor dies 111 and 112 in the normal direction D3 of the substrate 10. Moreover, the plurality of pillars P connected to the bottom surface S130B of a plate portion 130K of the lid 13K are overlapped with the semiconductor die 110 in the normal direction D3 of the substrate 10 and extend into the plurality of cavities C11 on the backside surface S110b of the semiconductor die 110. Furthermore, the plurality of pillars P are not overlapped with the semiconductor dies 111 and 112 in the normal direction D3 of the substrate 10. In some alternative embodiments, the plurality of cavities C11 can be omitted.

In some embodiments, a periphery portion of the top surface S130T of the plate portion 130K is flush with the top surface S132T of a frame portion 132K of the lid 13K, and a center portion of the top surface S130T of the plate portion 130K is lower than the top surface S132T of the frame portion 132K. The periphery portion of the top surface S130T of the plate portion 130K may have the ring shaped grooves G to secure the O shaped seal rings 29. In some alternative embodiments, the bottom surface S24B of the cover 24 has ring shaped grooves (not shown) to secure the O shaped seal rings 29.

Figure 13:
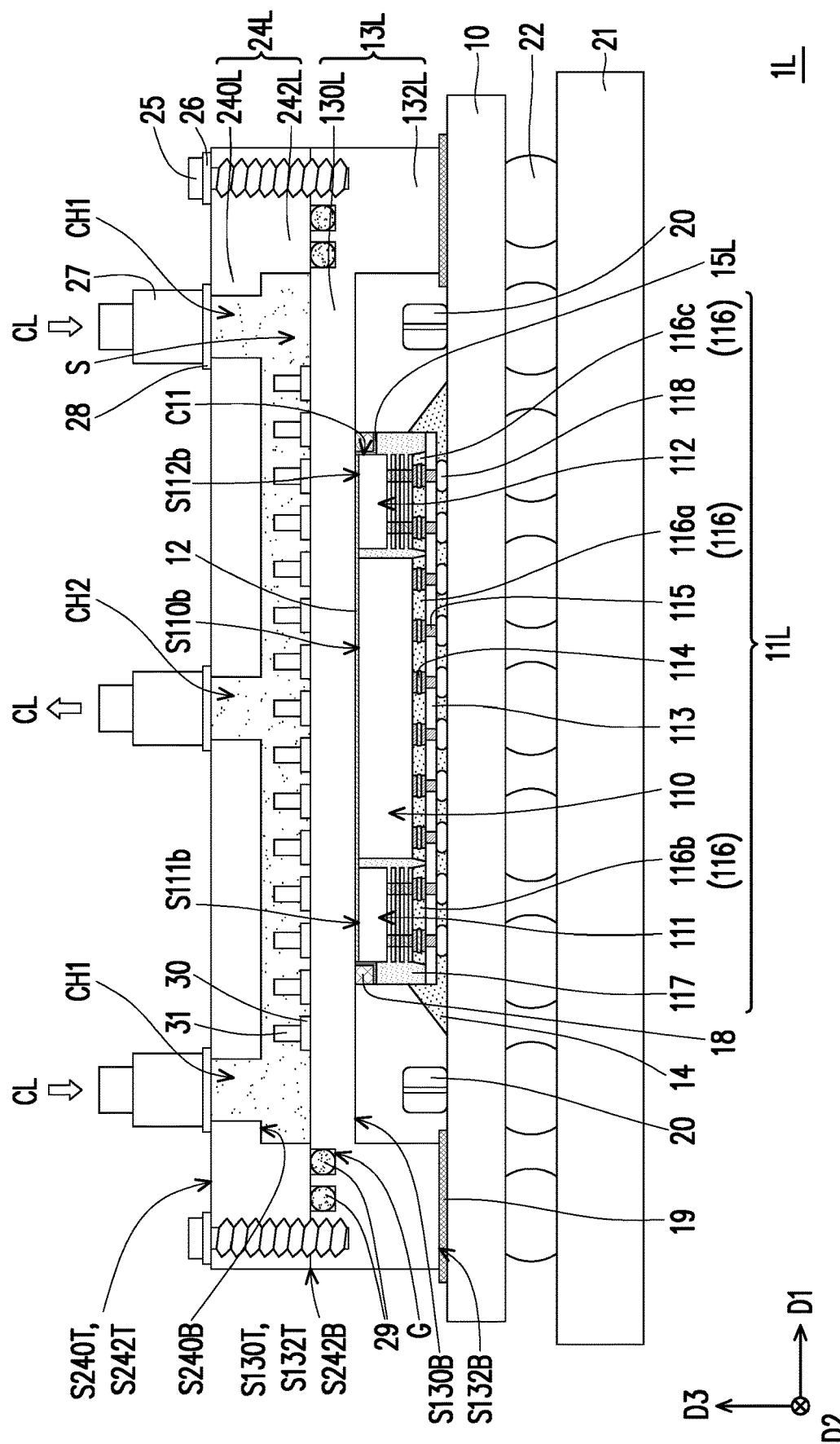

Referring to FIG. 13, a semiconductor device 1L may include a semiconductor package 11L, a lid 13L, a backside metal layer 15L, and a cover 24L in addition to the substrate 10, the thermal conductive bonding layer 12, the underfill 14, the bonding layer 18, the bonding layer 19, the plurality of passive components 20, the printed circuit board 21, the connectors 22, the screws 25, the washers 26, the pipes 27, the washers 28, the O shaped seal rings 29, the plurality of bonding patterns 30, and the plurality of pillars 31 described above.

The semiconductor package 11L is similar to those previously discussed with reference to the semiconductor package 11 in FIG. 11. However, a plurality of cavities C11 are located at edges of the backside surface of the semiconductor package 11L and overlapped with the encapsulant 117 in the normal direction D3 of the substrate 10. The backside metal layer 15L is disposed in the plurality of cavities C11 and connected to the bonding layer 18. In some embodiments, the backside metal layer 15L is not located between the thermal conductive bonding layer 12 and the semiconductor package 11L, and the thermal conductive bonding layer 12 is connected to the semiconductor package 11L.

The lid 13L is similar to those previously discussed with reference to the lid 13J in FIG. 11. However, the top surface S130T of a plate portion 130L of the lid 13L is flush with the top surface S132T of a frame portion 132L of the lid 13L.

The cover 24L may include a plate portion 240L and a frame portion 242L. The plate portion 240L covers the plurality of pillars 31, and the inflow channels CH1 and the outflow channel CH2 are located in the plate portion 240L. The frame portion 242L is located at edges of the plate portion 240L and protrudes towards the lid 13L. In some embodiments, the frame portion 242L of the cover 24L is fixed on the frame portion 132L of the lid 13L through screws or adhesives, and the O shaped seal rings 29 are located between the frame portion 242L of the cover 24L and the frame portion 132L of the lid 13L. In some embodiments, the top surface S240T of the plate portion 240L is flush with the top surface S242T of the frame portion 242L. In some embodiments, the bottom surface S242B of the frame portion 242L is lower than the bottom surface S240B of the plate portion 240L and connected to the top surface S132T of the frame portion 132L. The plurality of bonding patterns 30 and the plurality of pillars 31 may be enclosed by the frame portion 242L, the plate portion 240L, and the lid 13L. In some embodiments, the plurality of pillars 31 are spaced apart from the bottom surface S240B of the plate portion 240L. In some embodiments, the frame portion 242L extends in a direction (e.g., an opposite direction of the normal direction D3) perpendicular to the substrate 10. In some embodiments, multiple portions (e.g., the plate portion 240L and the frame portion 242L) of the cover 24L are fabricated separately and then assembled through additional elements (e.g., screws, adhesives, or combination thereof). In some alternative embodiments, multiple portions of the cover 24L are fabricated separately and then assembled (e.g., welded) without additional elements. In some alternative embodiments, multiple portions of the cover 24L are integrally formed. The semiconductor device of any of the embodiments in the disclosure can be improved as described above. For example, any of the semiconductor device 1 in FIG. 1 through the semiconductor device 1K in FIG. 12, or any of the following embodiments can be improved as described above, and will not be described again below.

Figure 14A:
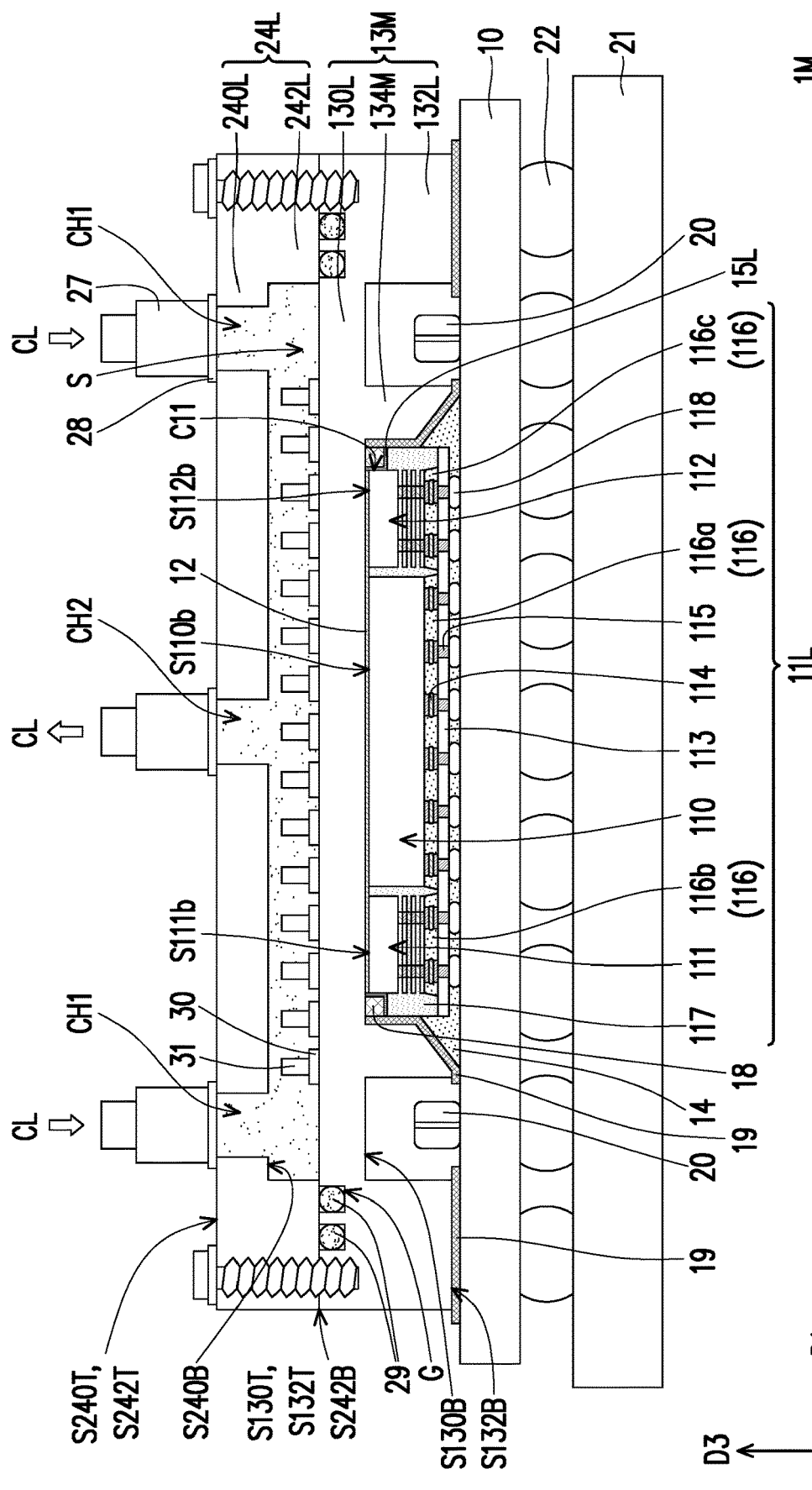

Referring to FIG. 14A, a semiconductor device 1M may include a lid 13M in addition to the substrate 10, the semiconductor package 11L, the thermal conductive bonding layer 12, the underfill 14, the backside metal layer 15L, the bonding layer 18, the bonding layer 19, the plurality of passive components 20, the printed circuit board 21, the connectors 22, the cover 24L, the screws 25, the washers 26, the pipes 27, the washers 28, the O shaped seal rings 29, the plurality of bonding patterns 30, and the plurality of pillars 31 described above.

The lid 13M is similar to those previously discussed with reference to the lid 13L in FIG. 13. However, the lid 13M includes an auxiliary support portion 134M in addition to the plate portion 130L and the frame portion 132L described above. The auxiliary support portion 134M may be located between the semiconductor package 11L and the passive components 20 and supported between the plate portion 130L and the underfill 14 to strengthen the support. In some embodiments, the bonding layer 19 may be further located between the auxiliary support portion 134M and the underfill 14 and between the auxiliary support portion 134M and the semiconductor package 11L. In some embodiments, the auxiliary support portion 134M, the plate portion 130L and the frame portion 132L are integrally formed. The semiconductor device of any of the embodiments in the disclosure can be improved as described above, and will not be described again below.

Figure 14B:
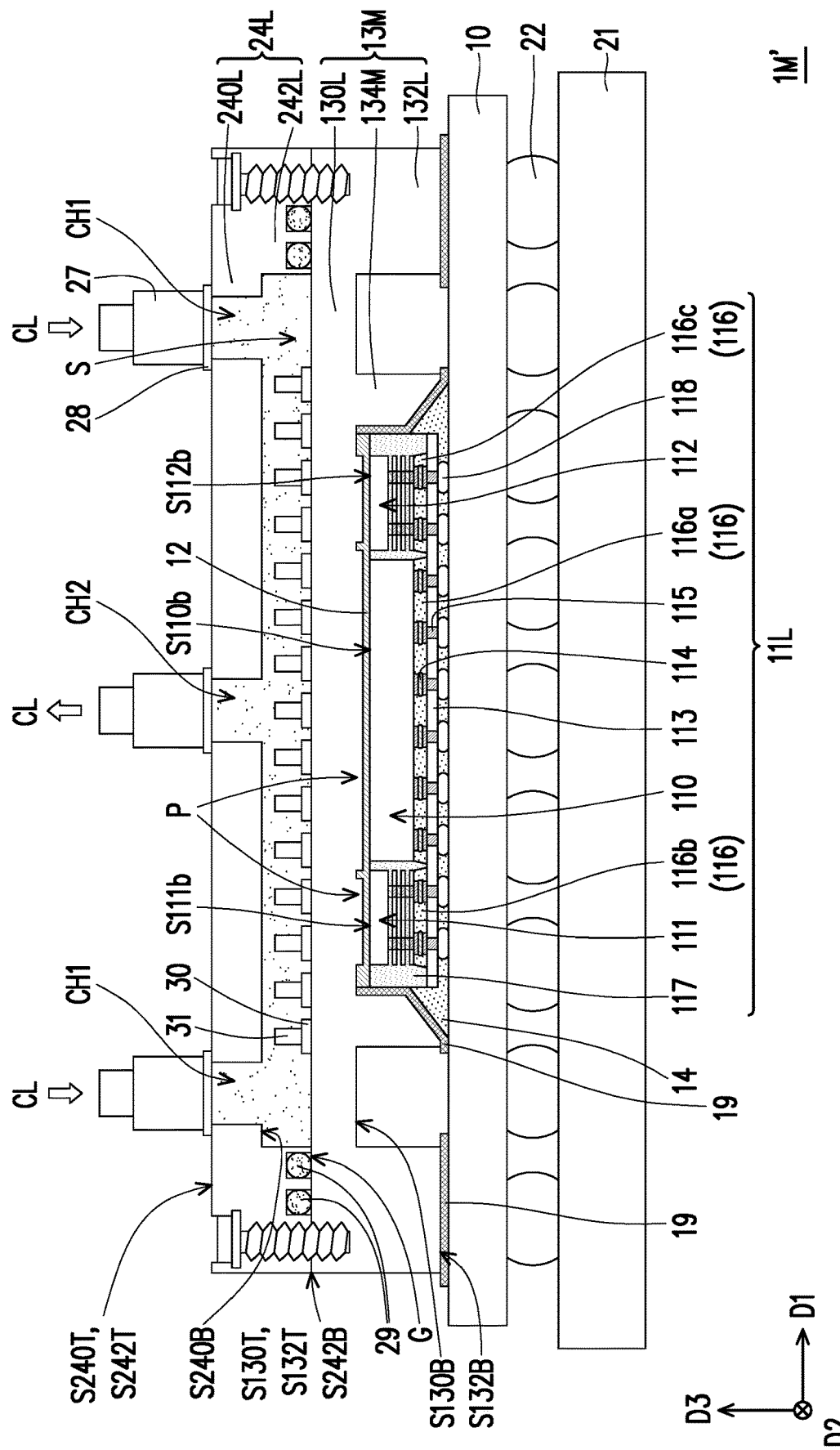

Referring to FIG. 14B, a semiconductor device 1M' is similar to those previously discussed with reference to the semiconductor device 1M in FIG. 14A. However, in the semiconductor device 1M', the bottom surface S242B of the frame portion 242L of the cover 24L has ring shaped grooves G to secure the O shaped seal rings 29. Moreover, a plurality of pillars P (or a plurality of blocks) are connected to the bottom surface S130B of the plate portion 130L and extended into the thermal conductive bonding layer 12 to reduce the thickness of the thermal conductive bonding layer 12 or to reduce the overall thermal resistance, and thus improving the heat dissipation performance. In some embodiments, the bonding layer 18 and the backside metal layer 15L in FIG. 14A can be omitted. In some embodiments, the auxiliary support portion 134M can be omitted.

Figure 15:
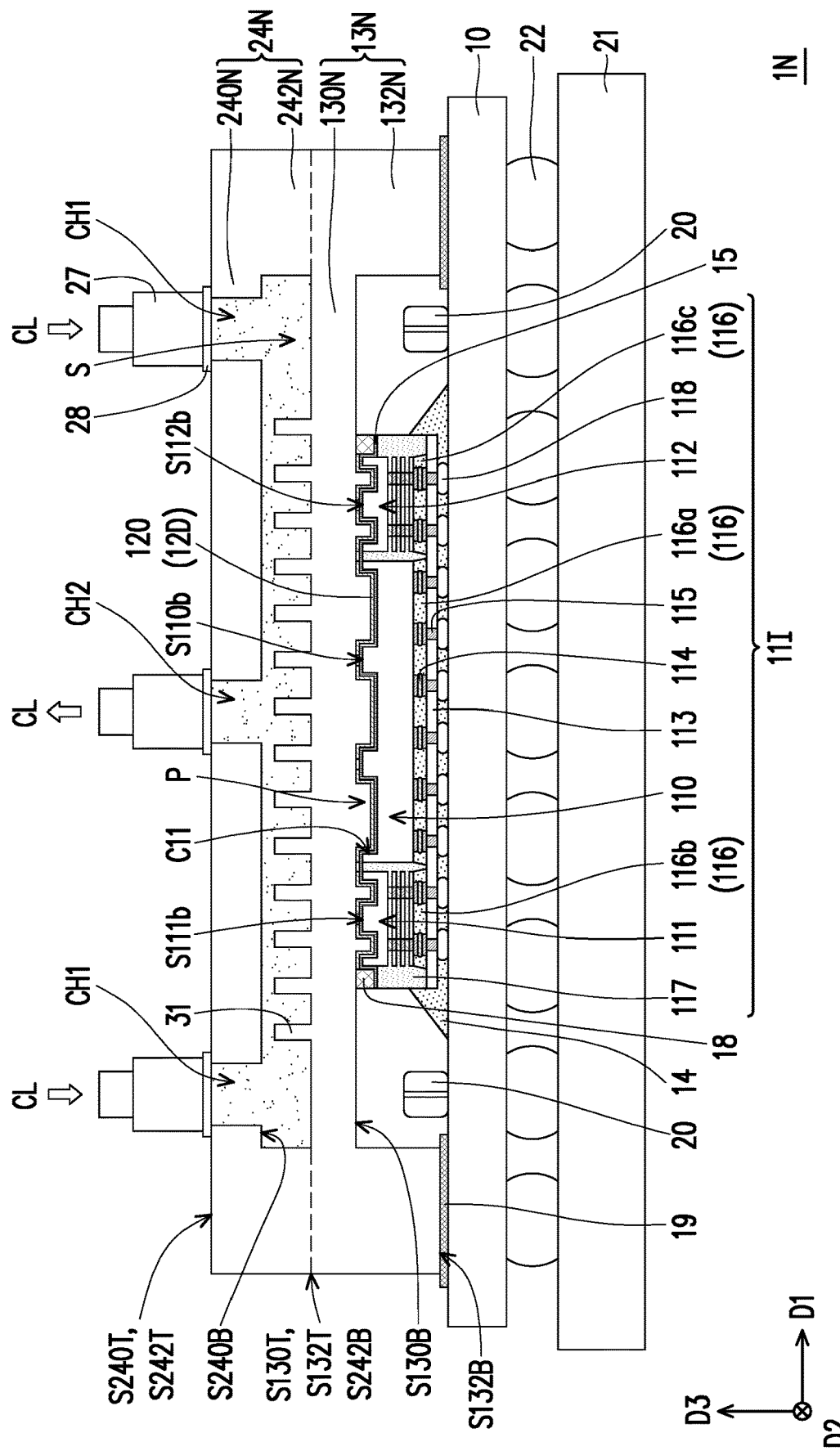

Referring to FIG. 15, a semiconductor device 1N may include a lid 13N and a cover 24N in addition to the substrate 10, the semiconductor package 11I, the thermal conductive bonding layer 12D, the underfill 14, the backside metal layer 15, the bonding layer 18, the bonding layer 19, the plurality of passive components 20, the printed circuit board 21, the connectors 22, the pipes 27, the washers 28, and the plurality of pillars 31 described above.

In the semiconductor device 1N, a plate portion 130N of the lid 13N and a frame portion 132N of the lid 13N may be integrally formed, and a plate portion 240N of the cover 24N and a frame portion 242N of the cover 24N may be integrally formed. The lid 13N and the cover 24N may be welded together, and thus the screws 25, the washers 26, and the O shaped seal rings 29 in FIG. 14A may be omitted.

Figure 16:
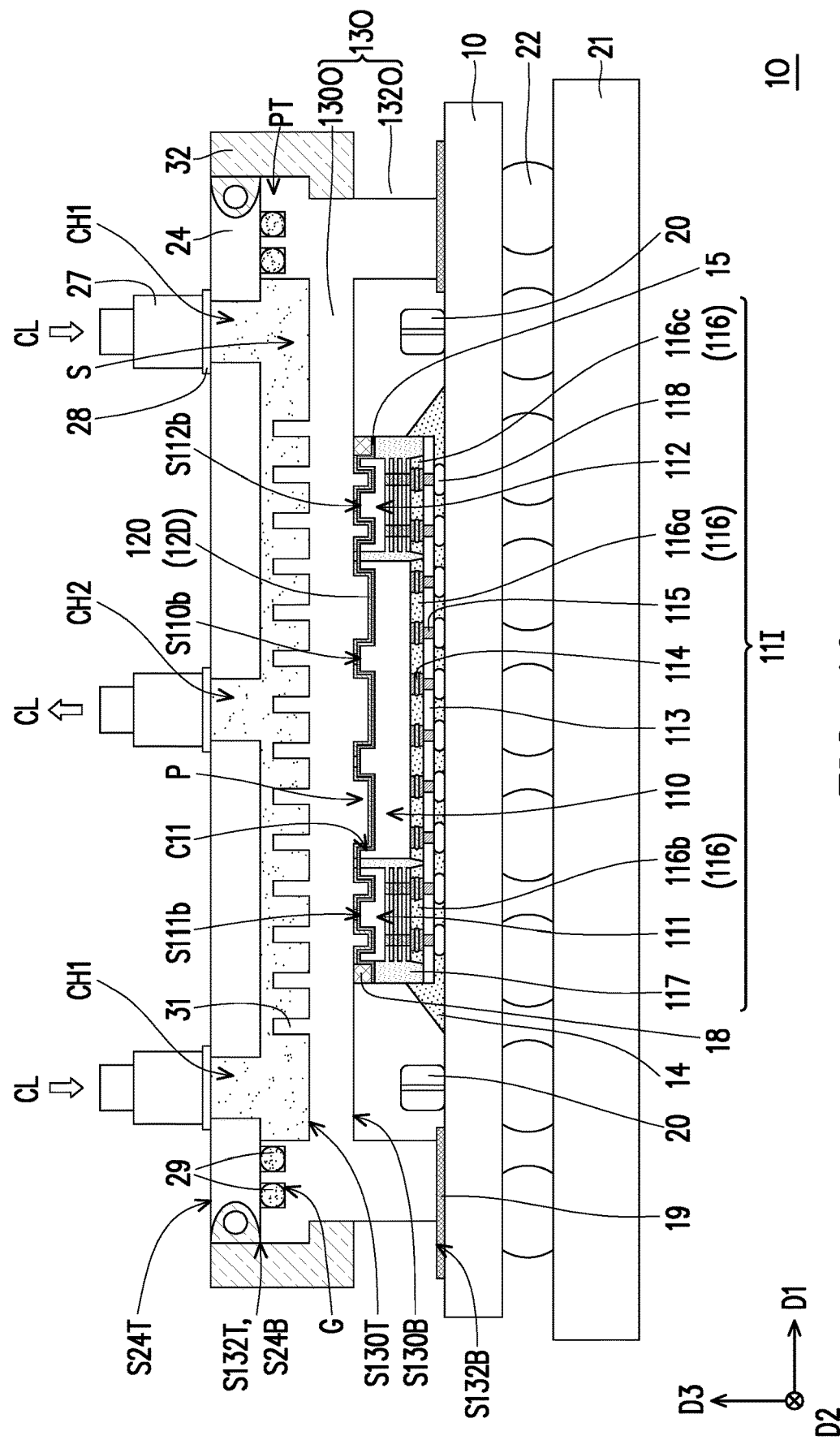

Referring to FIG. 16, a semiconductor device 1O may include a lid 13O and buckles 32 in addition to the substrate 10, the semiconductor package 11I, the thermal conductive bonding layer 12D, the underfill 14, the backside metal layer 15, the bonding layer 18, the bonding layer 19, the plurality of passive components 20, the printed circuit board 21, the connectors 22, the cover 24, the pipes 27, the washers 28, the O shaped seal rings 29, and the plurality of pillars 31 described above.

In the lid 13O, the plurality of pillars P and the plurality of pillars 31 are respectively connected to the bottom surface S130B and the top surface S130T of a plate portion 130O of the lid 13O. The top surface S130T of the plate portion 130O of the lid 13O is lower than the top surface S132T of a frame portion 132O of the lid 13O. An upper part of the frame portion 132O has a protrusion PT to engage with the buckles 32 fixed on the edge of the cover 24. In some alternative embodiments, the lid 13O and the cover 24 may be fixed together through screws, buckles, a seal ring or a combination thereof.

Figure 17:
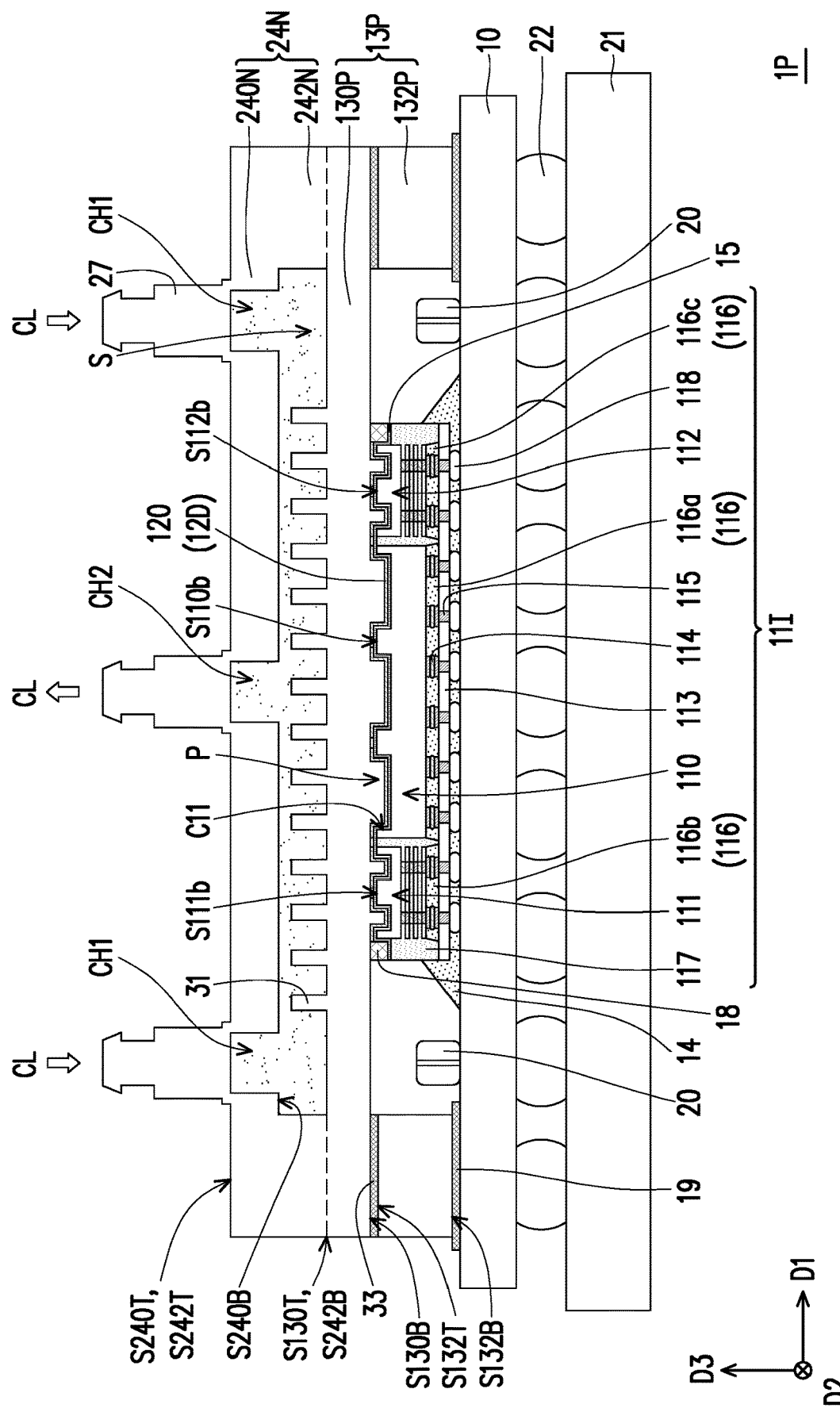

Referring to FIG. 17, a semiconductor device 1P may include a lid 13P and a bonding layer 33 in addition to the substrate 10, the semiconductor package 11I, the thermal conductive bonding layer 12D, the underfill 14, the backside metal layer 15, the bonding layer 18, the bonding layer 19, the plurality of passive components 20, the printed circuit board 21, the connectors 22, the cover 24N, the pipes 27, the washers 28, and the plurality of pillars 31 described above.

In the lid 13P, a plate portion 130P of the lid 13P is spaced apart from a frame portion 132P of the lid 13P. The plate portion 130P extends onto the frame portion 132P and overlaps the frame portion 132P in the normal direction D3 of the substrate 10. In some embodiments, the plate portion 130P and the frame portion 132P are bonded together through the bonding layer 33. A material of the bonding layer 33 may be similar to those previously discussed with reference to the bonding layer 19, and will not be repeated here. In some alternative embodiments, the frame portion 132P and the plate portion 130P are fixed together through screws, adhesives or combination thereof. In some embodiments, the plate portion 130P of the lid 13P, the cover 24N, and the pipes 27 are welded together, and the washers 28 may be omitted.

Figure 18:
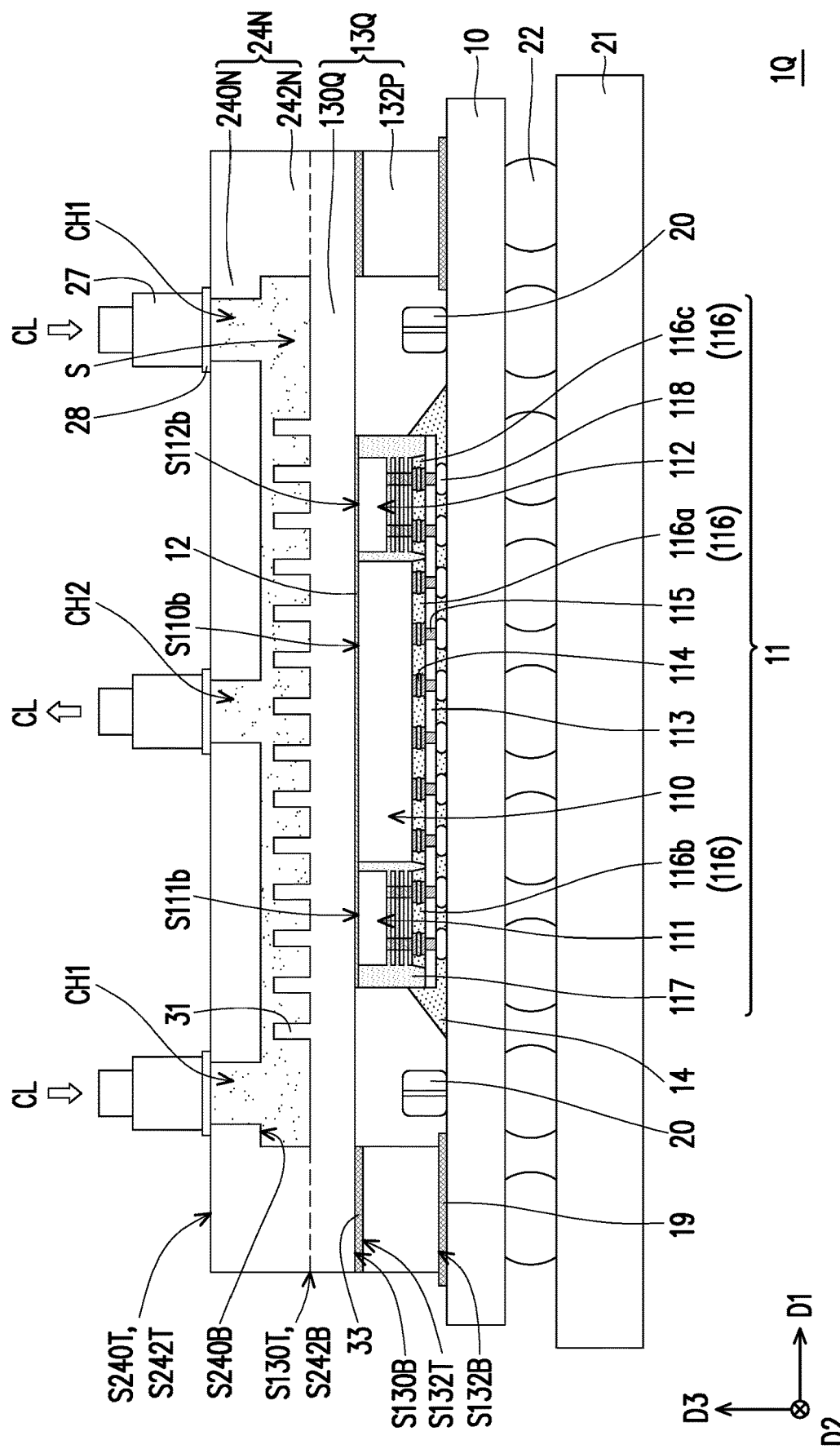

Referring to FIG. 18, a semiconductor device 1Q may include a lid 13Q in addition to the substrate 10, the semiconductor package 11, the thermal conductive bonding layer 12, the underfill 14, the bonding layer 19, the plurality of passive components 20, the printed circuit board 21, the connectors 22, the cover 24N, the pipes 27, the washers 28, and the plurality of pillars 31, and the bonding layer 33 described above.

In the lid 13Q, the top surface S130T of a plate portion 130Q of the lid 13Q is connected to the plurality of pillars 31, and the bottom surface S130B of the plate portion 130Q is connected to the thermal conductive bonding layer 12. The plate portion 130Q extends onto the frame portion 132P and overlaps the frame portion 132P in the normal direction D3 of the substrate 10. In some embodiments, the plate portion 130Q and the cover 24N are welded together.

Figure 19:
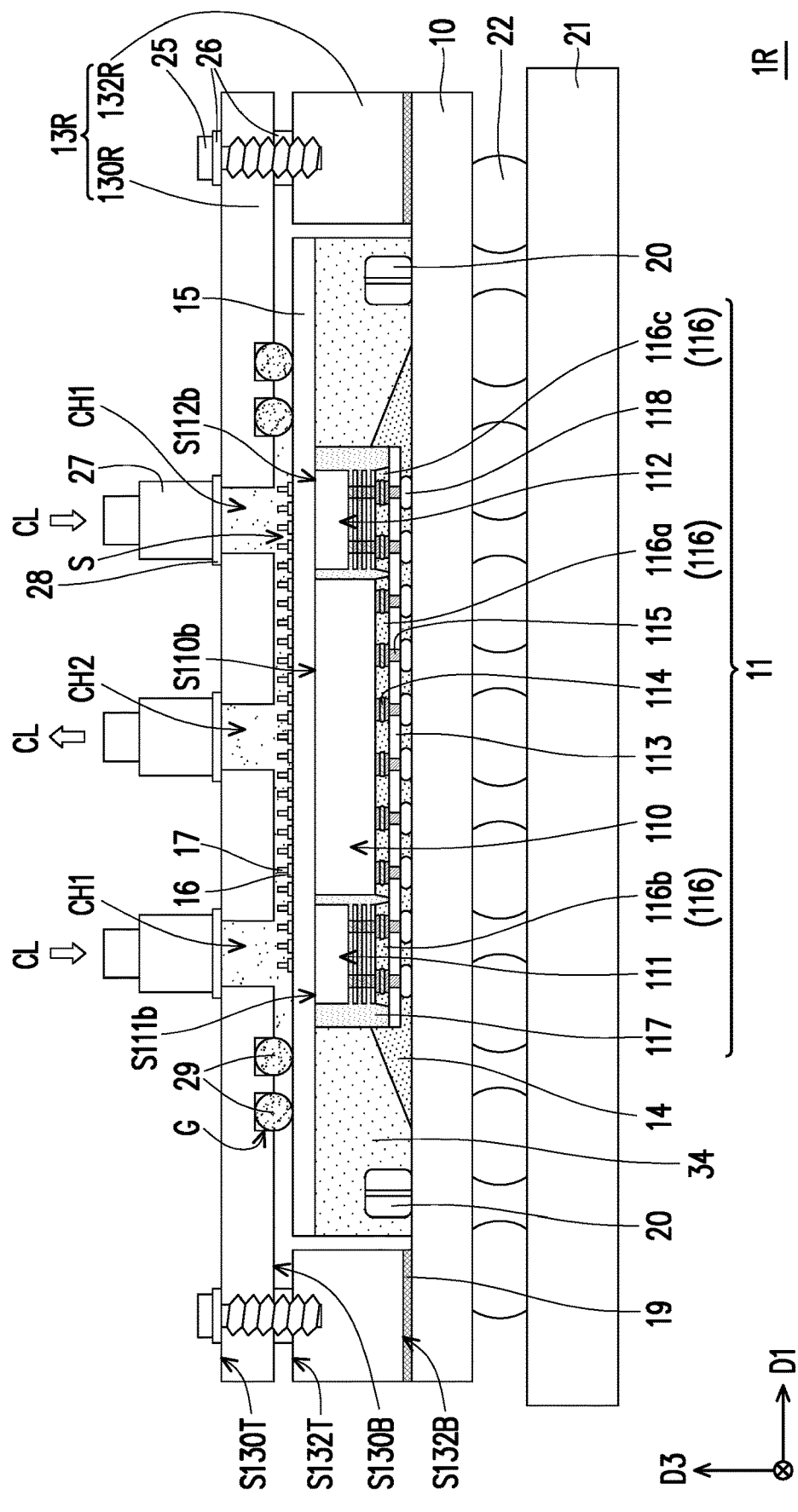

Referring to FIG. 19, a semiconductor device 1R may include a lid 13R and an encapsulant 34 in addition to the substrate 10, the semiconductor package 11, the underfill 14, the backside metal layer 15, the plurality of bonding patterns 16, the plurality of pillars 17, the bonding layer 19, the plurality of passive components 20, the printed circuit board 21, the connectors 22, the screws 25, the washers 26, the pipes 27, the washers 28, and the O shaped seal rings 29 described above.

The encapsulant 34 is disposed on the underfill 14 and the substrate 10. In some embodiments, the encapsulant 34 is further disposed on the plurality of passive components 20. In other words, the plurality of passive components 20 may be covered by the encapsulant 34. A method of forming the encapsulant 34 and a material of the encapsulant 34 may be similar to those previously discussed with reference to the encapsulant 117, and will not be repeated here.

The backside metal layer 15 is disposed on the semiconductor package 11 and the encapsulant 34. In some embodiments, the backside metal layer 15 is overlapped with the plurality of passive components 20 in the normal direction D3 of the substrate 10. The backside metal layer 15 may be a stacked layer of at least three layers. In some embodiments, the backside metal layer 15 may include a stacked layer of titanium (Ti), copper (Cu) and nickel (Ni), or a stacked layer of titanium (Ti), copper (Cu), nickel (Ni), and vanadium (V). Among the at least three layers of the backside metal layer 15, nickel (Ni) or vanadium (V) may be the upmost layer to improve the adhesion to the plurality of bonding patterns 16.

In some embodiments, the semiconductor device 1R further includes a protection layer (not shown in FIG. 19) disposed on the plurality of pillars 17, the plurality of bonding patterns 16, and the backside metal layer 15. In some embodiments, a material of the protection layer includes diamond like carbon (DLC) or other coating material with high thermal conductivity. In some embodiments, the protection layer is formed through a thin film deposition process, such as a physical vapor deposition (PVD) process, a chemical vapor deposition (CVD) process, a spraying process, a coating process, or the like. The semiconductor device of any of the following embodiments (e.g., the embodiments in which the plurality of pillars are disposed on the semiconductor package) can be improved as described above, and will not be described again below.

In the lid 13R, a plate portion 130R of the lid 13R covers the semiconductor package 11, the encapsulant 34 and a frame portion 132R of the lid 13R, and the plate portion 130R is supported by the frame portion 132R on the substrate 10. In some embodiments, the frame portion 132R is a ring shaped structure, and the frame portion 132R is fixed on the substrate 10 through the bonding layer 19. In some embodiments, the plate portion 130R is fixed on the frame portion 132R through the screws 25 and the washers 26. In such embodiments, both of the plate portion 130R and the frame portion 132R have a threaded structure for screw fixing, and the washers 26 may be disposed on the top surface S130T of the plate portion 130R and between the bottom surface S130B of the plate portion 130R and the top surface S132T of the frame portion 132R to secure the attachment of the screws 25 to the plate portion 130R and the frame portion 132R.

The O shaped seal rings 29 may be disposed on the backside metal layer 15, and the ring shaped grooves G for securing the O shaped seal rings 29 may be located on the bottom surface S130B of the plate portion 130R. In some embodiments, the O shaped seal rings 29 and the ring shaped grooves G may be overlapped with the encapsulant 34 in the normal direction D3 of the substrate 10.

The plate portion 130R may include the inflow channels CH1 and the outflow channel CH2 to allow the coolant CL to flow into and out of the space S between the plate portion 130R, the O shaped seal ring 29, the backside metal layer 15, the plurality of bonding patterns 16, and the plurality of pillars 17.

By covering the semiconductor package 11 with the backside metal layer 15 to prevent the coolant CL from contacting the semiconductor package 11, the reliability of the semiconductor device 1R can be improved. Moreover, by disposing the plurality of pillars 17 closer to the heat sources (e.g., disposing the plurality of pillars 17 on the semiconductor package 11), the heat dissipation of the semiconductor device 1R may be improved, the structure design and manufacturing process of the lid 13R can be simplified, and the difficulty of assembly may be reduced. In some embodiments, the bottom surface S130B of the plate portion 130R are spaced apart from the plurality of pillars 17, so that the integrity of the plurality of pillars 17 can be maintained during assembly (avoiding deformation of the plurality of pillars 17 by external forces), the flexibility of assembly can be improved, or the influence of the alignment offset on the heat dissipation effect can be reduced.

Figure 20:
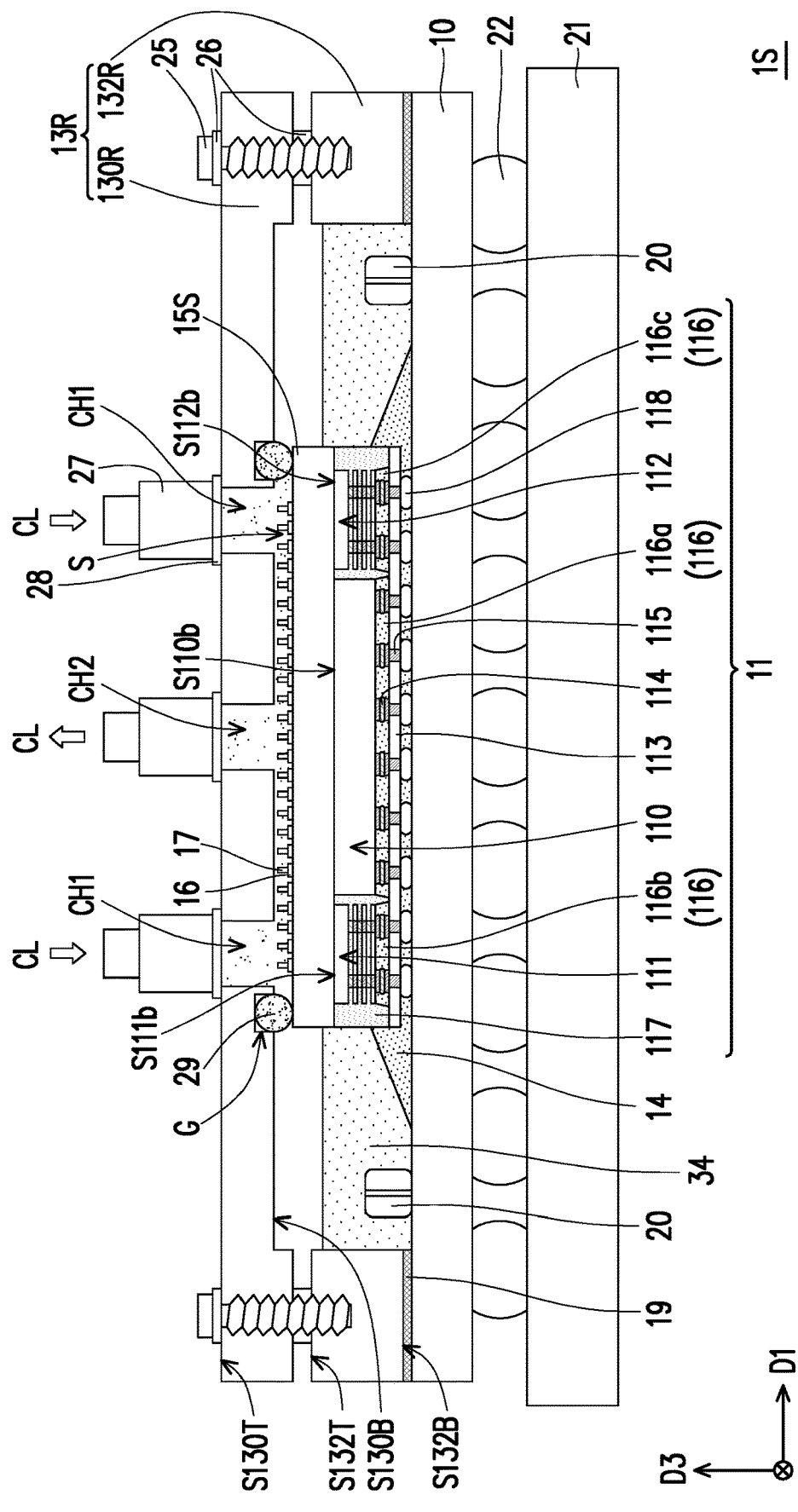

Referring to FIG. 20, a semiconductor device 1S may include a backside metal layer 15S in addition to the substrate 10, the semiconductor package 11, the lid 13R, the underfill 14, the plurality of bonding patterns 16, the plurality of pillars 17, the bonding layer 19, the plurality of passive components 20, the printed circuit board 21, the connectors 22, the screws 25, the washers 26, the pipes 27, the washers 28, the O shaped seal rings 29, and the encapsulant 34 described above.

The backside metal layer 15S is, for example, a stacked layer of titanium (Ti), copper (Cu) and nickel (Ni) sequentially disposed on the semiconductor package 11, and the copper (Cu) layer may be thicker than the titanium (Ti) and nickel (Ni) layers. In some embodiments, the copper (Cu) layer among the stacked layer may be formed by a plating process, and the titanium (Ti) and nickel (Ni) layers among the stacked layer may be formed by one of a sputtering process, a physical vapor deposition (PVD) process, a plating process, and an electron beam evaporation process. In some alternative embodiments, the copper (Cu) layer among the stacked layer may be formed by a combination of at least two kinds of fabricating process listed above, and the combination may include the plating process.

In some embodiments, the encapsulant 34 is formed subsequent to the backside metal layer 15S. In such embodiments, the encapsulant 34 is not covered by the backside metal layer 15S. In other words, the encapsulant 34 is not overlapped with the backside metal layer 15S in the normal direction D3 of the substrate 10.

In some embodiments, a center portion (e.g. a portion, of the plate portion 130R, which is overlapped with the encapsulant 34 and the semiconductor package 11) of the plate portion 130R of the lid 13R may be thinner than a periphery portion (e.g. a portion, of the plate portion 130R, which is overlapped with the frame portion 132R) of the plate portion 130R of the lid 13R.

The O shaped seal rings 29 may be disposed on the backside metal layer 15S, and the ring shaped grooves G for securing the O shaped seal rings 29 may be located on the bottom surface S130B of the plate portion 130R. In some embodiments, the O shaped seal rings 29 and the ring shaped grooves G may not be overlapped with the encapsulant 34 in the normal direction D3 of the substrate 10.

Figure 21:
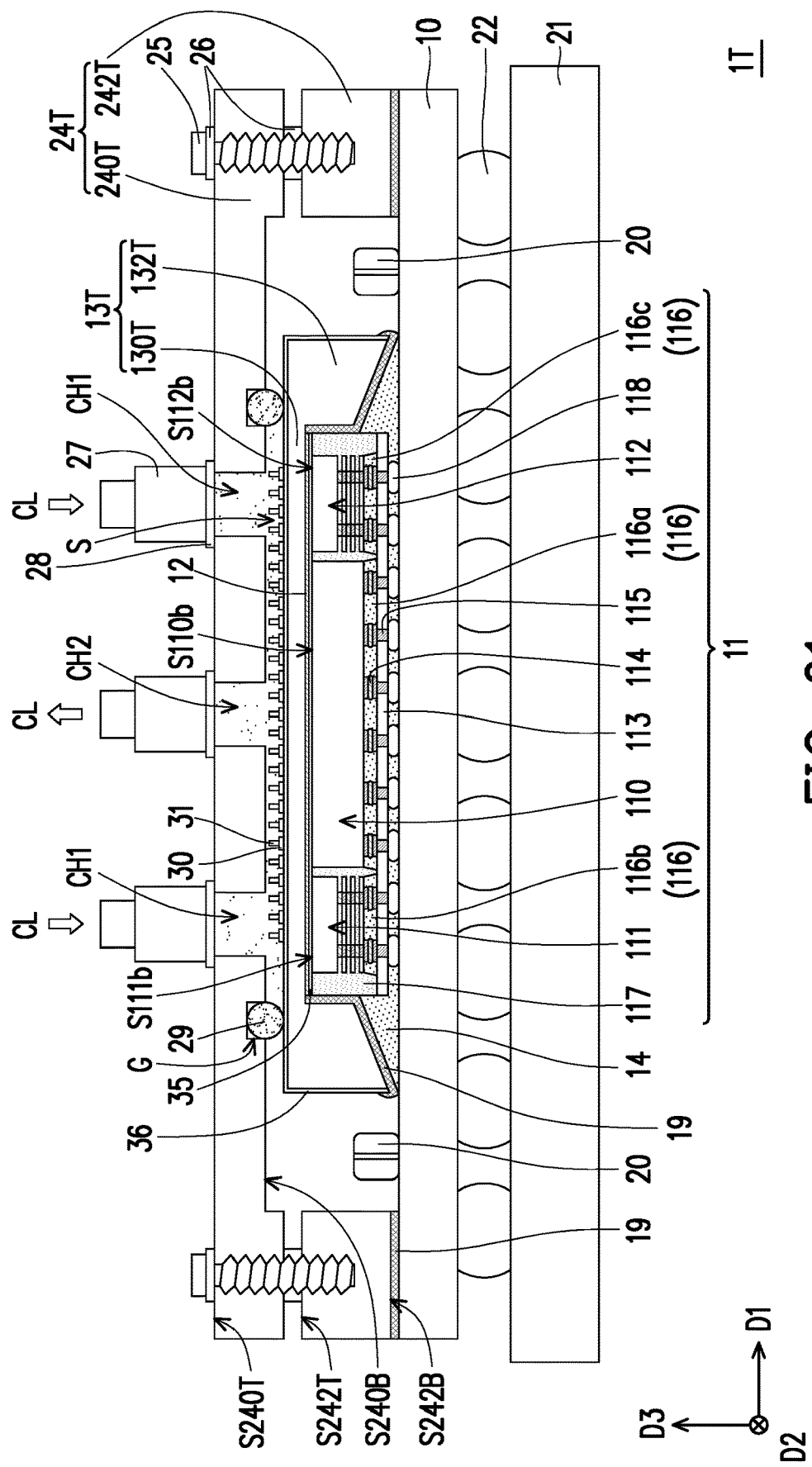

Referring to FIG. 21, a semiconductor device 1T may include a lid 13T, a cover 24T, an adhesion enhancement layer 35, and an adhesion enhancement layer 36 in addition to the substrate 10, the semiconductor package 11, the thermal conductive bonding layer 12, the underfill 14, the bonding layer 19, the plurality of passive components 20, the printed circuit board 21, the connectors 22, the screws 25, the washers 26, the pipes 27, the washers 28, the O shaped seal ring 29, the plurality of bonding patterns 30, and the plurality of pillars 31 described above.

The lid 13T may be disposed between the semiconductor package 11 and the cover 24T and between the underfill 14 and the cover 24T. In some embodiments, the lid 13T includes a plate portion 130T and a frame portion 132T connected to the plate portion 130T. The plate portion 130T covers the semiconductor package 11 and is attached to the thermal conductive bonding layer 12. In some embodiments, the plate portion 130 extends substantially parallel to the substrate 10. The frame portion 132T is located at edges of the plate portion 130 and protrudes towards the substrate 10.

In some embodiments, the underfill 14 may be further located between the frame portion 132T and the substrate 10, and the frame portion 132T is attached to the underfill 14 through the bonding layer 19. In other words, the bonding layer 19 may be further located between the frame portion 132T and the underfill 14. In some embodiments, a material of the plate portion 130T and the frame portion 132T may include copper. In some alternative embodiments, a material of the plate portion 130T and the frame portion 132T may include metals or metal alloys, such as copper, aluminum, their alloys, the combinations thereof or the like.

The adhesion enhancement layer 35 is disposed between the thermal conductive bonding layer 12 and the semiconductor package 11. In some embodiments, a material of the adhesion enhancement layer 35 includes gold (Au), silver (Ag), copper (Cu), or the like. In some embodiments, the bonding layer 19 may be in contact with the underfill 14, sidewalls of the semiconductor package 11, the adhesion enhancement layer 35, and the thermal conductive bonding layer 12.

The adhesion enhancement layer 36 is disposed on the lid 13T and in contact with the plurality of bonding patterns 30 and the lid 13T. In some embodiments, the adhesion enhancement layer 36 is disposed on outer surfaces (surfaces of the lid 13T that face the cover 24T) of the lid 13T as well as inner surfaces (surfaces of the lid 13T that face the semiconductor package 11 and the underfill 14) of the lid 13T. In some embodiments, if the material of the thermal conductive bonding layer 12 includes nano silver paste, the adhesion enhancement layer 36 may not be disposed on the inner surfaces of the lid 13T. A material of the adhesion enhancement layer 36 may include nickel (Ni), but not limited thereto.

The cover 24T is disposed on the substrate 10, wherein the lid 13T, the plurality of bonding patterns 30, the plurality of pillars 31, and the plurality of passive components 20 are covered by the cover 24T. In some embodiments, the cover 24T includes a plate portion 240T and a frame portion 242T. The plate portion 240T covers the lid 13T, the plurality of bonding patterns 30, the plurality of pillars 31, the plurality of passive components 20, and the frame portion 242T. The plate portion 240T is supported by the frame portion 242T on the substrate 10. In some embodiments, the frame portion 242T is a ring shaped structure, and the frame portion 242T is fixed on the substrate 10 through the bonding layer 19. In some embodiments, the plate portion 240T is fixed on the frame portion 242T through the screws 25 and the washers 26. In such embodiments, both of the plate portion 240T and the frame portion 242T have a threaded structure for screw fixing, and the washers 26 may be disposed on the top surface S240T of the plate portion 240T and between the bottom surface S240B of the plate portion 240T and the top surface S242T of the frame portion 242T to secure the attachment of the screws 25 to the plate portion 240T and the frame portion 242T.

In some embodiments, a center portion (e.g. a portion, of the plate portion 240T, which is overlapped with the lid 13T and the plurality of passive components 20) of the plate portion 240T of the cover 24T may be thinner than a periphery portion (e.g. a portion, of the plate portion 240T, which is overlapped with the frame portion 242T) of the plate portion 240T of the cover 24T.

The O shaped seal ring 29 may be disposed on the lid 13T, and the ring shaped groove G for securing the O shaped seal ring 29 may be located on the bottom surface S240B of the plate portion 240T of the cover 24T. In some embodiments, the O shaped seal ring 29 and the ring shaped groove G may be overlapped with the frame portion 132T in the normal direction D3 of the substrate 10.

The plate portion 240T of the cover 24T may include the inflow channels CH1 and the outflow channel CH2 to allow the coolant CL to flow into and out of the space S between the plate portion 240T, the O shaped seal ring 29, the adhesion enhancement layer 36, the plurality of bonding patterns 30, and the plurality of pillars 31.

Figure 22:
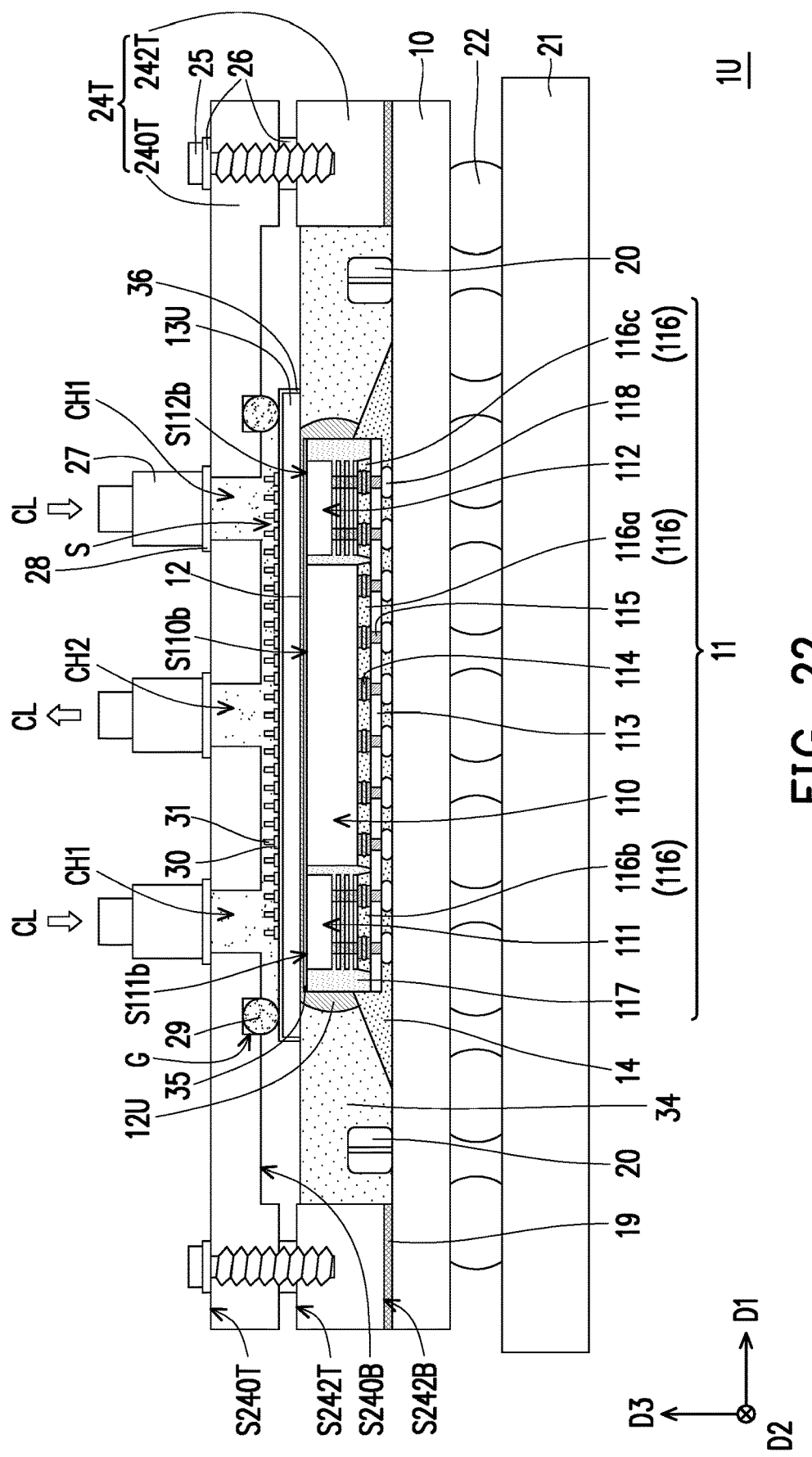

Referring to FIG. 22, a semiconductor device 1U may include a thermal conductive bonding layer 12U and a lid 13U in addition to the substrate 10, the semiconductor package 11, the underfill 14, the bonding layer 19, the plurality of passive components 20, the printed circuit board 21, the connectors 22, the cover 24T, the screws 25, the washers 26, the pipes 27, the washers 28, the O shaped seal ring 29, the plurality of bonding patterns 30, the plurality of pillars 31, the encapsulant 34, the adhesion enhancement layer 35, and the adhesion enhancement layer 36 described above.

The lid 13U may be a plate-like lid that is parallel to the substrate 10. In some embodiments, a material of the lid 13U may include copper. In some alternative embodiments, a material of the lid 13U may include metals or metal alloys, such as copper, aluminum, their alloys, the combinations thereof or the like.

In some embodiments, the adhesion enhancement layer 36 is disposed on outer surfaces (surfaces of the lid 13U that face the cover 24T) of the lid 13U as well as an inner surface (a surface of the lid 13U that faces the semiconductor package 11) of the lid 13U. In some embodiments, if the material of the thermal conductive bonding layer 12U includes nano silver paste, the adhesion enhancement layer 36 may not be disposed on the inner surface of the lid 13U. A material of the adhesion enhancement layer 36 may include nickel (Ni), but not limited thereto.

The thermal conductive bonding layer 12U is disposed on the adhesion enhancement layer 35 and extends towards the underfill 14. In some embodiments, the thermal conductive bonding layer 12U is in contact with the adhesion enhance layer 35, sidewall of the semiconductor package 11 and the underfill 14. In some embodiments, the plurality of passive components 20 as well as the underfill 14 that is not covered by the thermal conductive bonding layer 12U are covered by the encapsulant 34. In some alternative embodiments, the encapsulant 34 is omitted.

Figure 23:
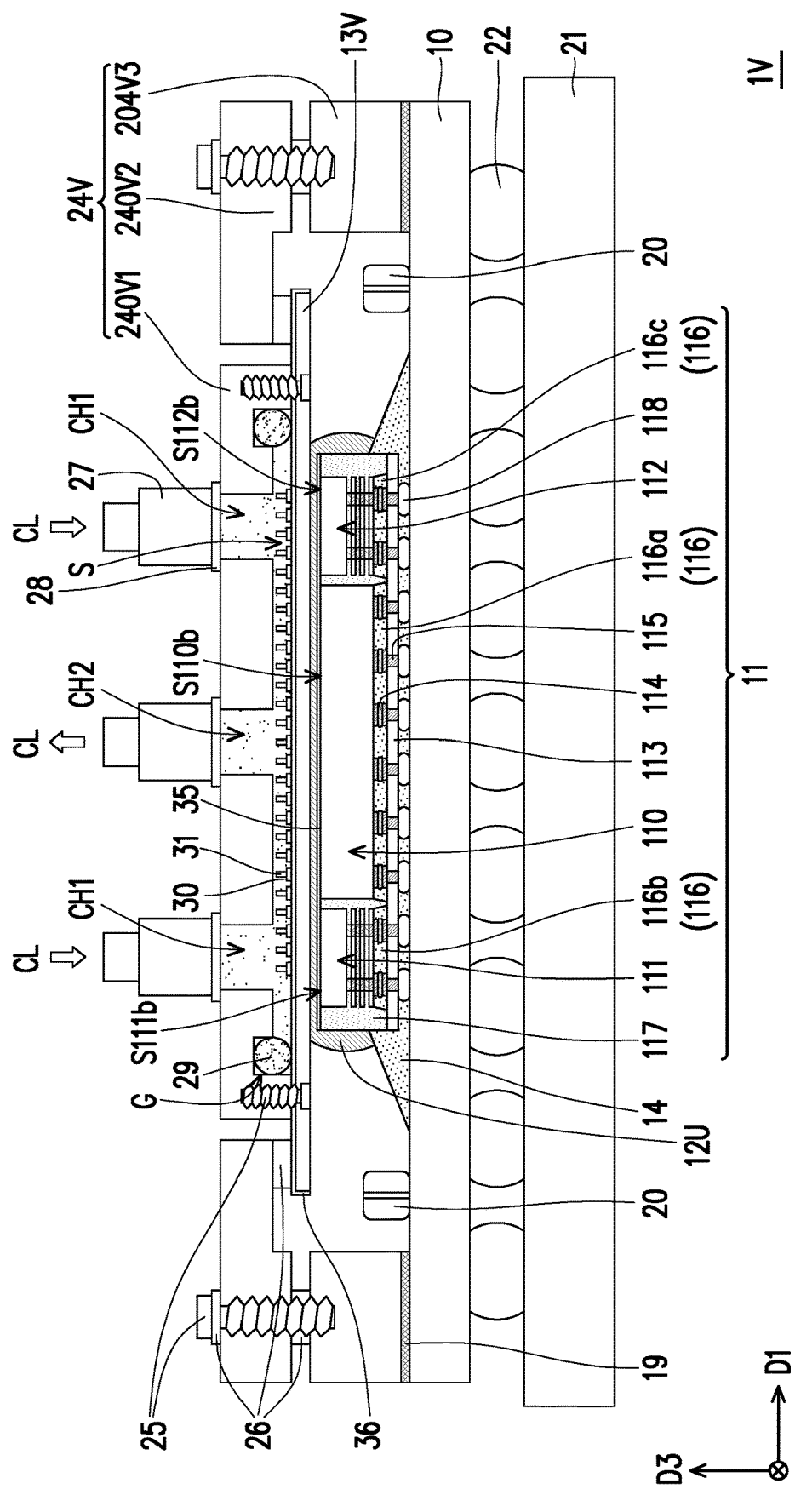

Referring to FIG. 23, a semiconductor device 1V may include a lid 13V and a cover 24V in addition to the substrate 10, the semiconductor package 11, the thermal conductive bonding layer 12U, the underfill 14, the bonding layer 19, the plurality of passive components 20, the printed circuit board 21, the connectors 22, the screws 25, the washers 26, the pipes 27, the washers 28, the O shaped seal ring 29, the plurality of bonding patterns 30, the plurality of pillars 31, the adhesion enhancement layer 35, and the adhesion enhancement layer 36 described above.

The lid 13V may be a plate-like lid that is parallel to the substrate 10. In some embodiments, a material of the lid 13V may include copper. In some alternative embodiments, a material of the lid 13V may include metals or metal alloys, such as copper, aluminum, their alloys, the combinations thereof or the like.

The cover 24V may include a first portion 240V1, a second portion 240V2, and a third portion 240V3. The first portion 240V1 is disposed on the lid 13V and includes the inflow channels CH1 and the outflow channel CH2. In some embodiments, the first portion 240V1 and the lid 13V have a threaded structure, and the first portion 240V1 and the lid 13V are fixed together by the screws 25. In some embodiments, the screws 25 are screwed to the first portion 240V1 from the lid 13V. In some embodiments, the ring shaped groove G is located on a surface of the first portion 240V1 which faces the lid 13V, and the ring shaped groove G is located between the plurality of pillars 31 and the screws 25. The O shaped seal ring 29 is disposed in the ring shaped groove G, and the space S into which the coolant CL flows is between the first portion 240V1, the O shaped seal ring 29, the adhesion enhancement layer 36, the plurality of bonding patterns 30, and the plurality of pillars 31.

In some embodiments, the third portion 240V3 is a ring shaped structure, and the third portion 240V3 is fixed on the substrate 10 through the bonding layer 19. In some embodiments, the second portion 240V2 is fixed on the third portion 240V3 through the screws 25 and the washers 26. In such embodiments, both of the second portion 240V2 and the third portion 240V3 have a threaded structure for screw fixing, and the washers 26 may be disposed on the second portion 240V2 and between the second portion 240V2 and the third portion 240V3 to secure the attachment of the screws 25 to the second portion 240V2 and the third portion 240V3. In some embodiments, the second portion 240V2 not only overlaps the third portion 240V3 in the normal direction D3 of the substrate 10 but also overlaps a peripheral portion of the lid 13V, and the washers 26 are further disposed between the lid 13V and the second portion 240V2. In some embodiments, the washers 26 disposed between the lid 13V and the second portion 240V2 are in contact with the second portion 240V2 and the adhesion enhancement layer 36 that is located on the lid 13V.

Figure 24:
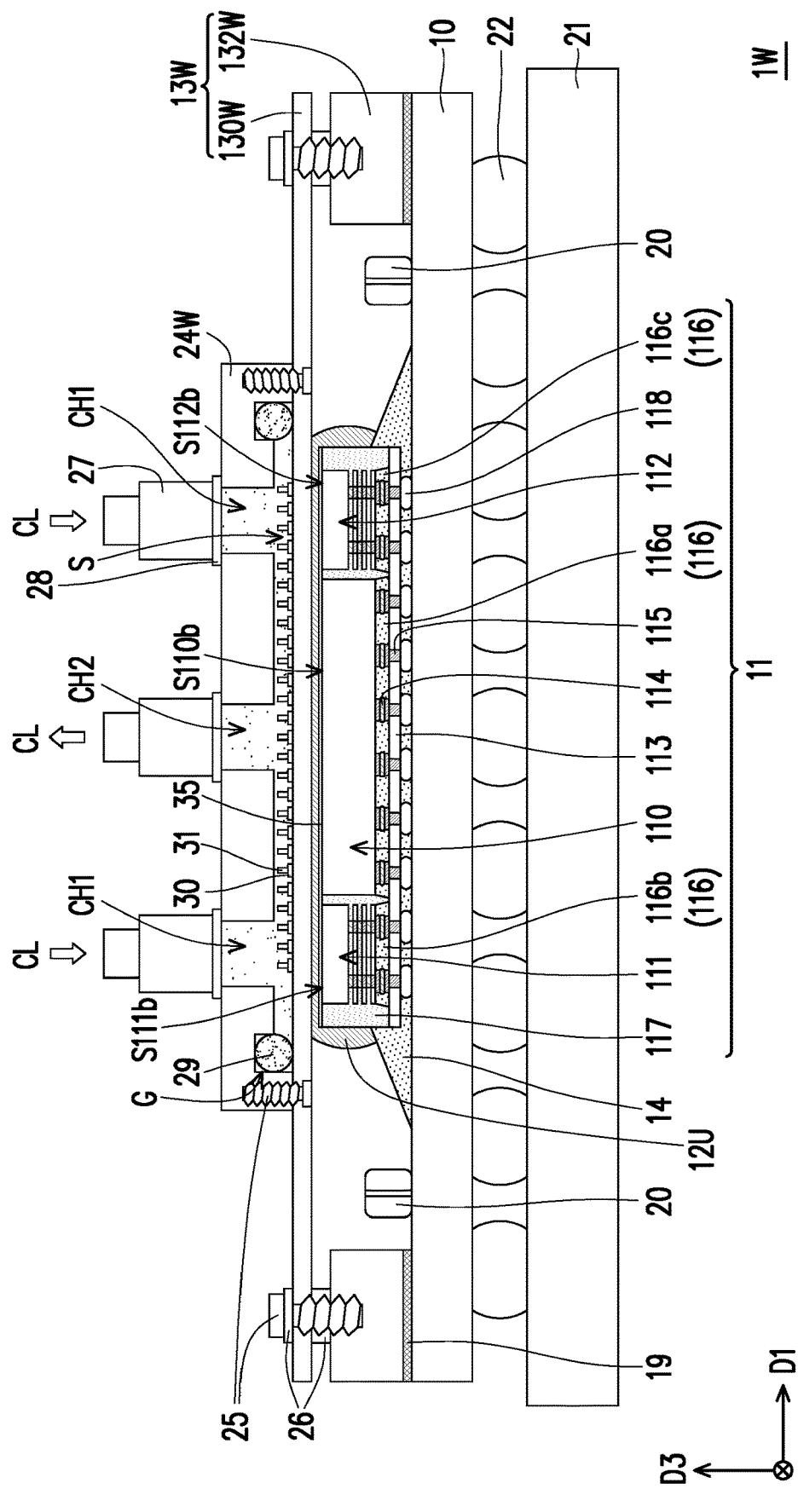

Referring to FIG. 24, a semiconductor device 1W may include a lid 13W and a cover 24W in addition to the substrate 10, the semiconductor package 11, the thermal conductive bonding layer 12U, the underfill 14, the bonding layer 19, the plurality of passive components 20, the printed circuit board 21, the connectors 22, the screws 25, the washers 26, the pipes 27, the washers 28, the O shaped seal ring 29, the plurality of bonding patterns 30, the plurality of pillars 31, and the adhesion enhancement layer 35 described above. In some alternative embodiments, the semiconductor device 1W further includes the adhesion enhancement layer 36 described above.

The lid 13W may include a plate portion 130W and a frame portion 132W. The plate portion 130W covers the semiconductor package 11 and connected to the thermal conductive bonding layer 12U. In some embodiments, the plate portion 130W extends substantially parallel to the substrate 10 and overlaps the frame portion 132W in the normal direction D3 of the substrate 10. The frame portion 132W is, for example, a ring shaped structure, and the frame portion 132W is fixed on the substrate 10 through the bonding layer 19. In some embodiments, the plate portion 130W is fixed on the frame portion 132W through the screws 25 and the washers 26.

The cover 24W is disposed on the plate portion 130W and overlapped with the semiconductor package 11 in the normal direction D3 of the substrate 10. In some embodiments, the cover 24W is fixed on the plate portion 130W by the screws 25. In some embodiments, the screws 25 are screwed to the cover 24W from the plate portion 130W. In some embodiments, the ring shaped groove G is located on a surface of the cover 24W which faces the lid 13W, and the ring shaped groove G is located between the plurality of pillars 31 and the screws 25. The O shaped seal ring 29 is disposed in the ring shaped groove G, and the space S into which the coolant CL flows is between the cover 24W, the O shaped seal ring 29, the plate portion 130W, the plurality of bonding patterns 30, and the plurality of pillars 31.

Figure 25:
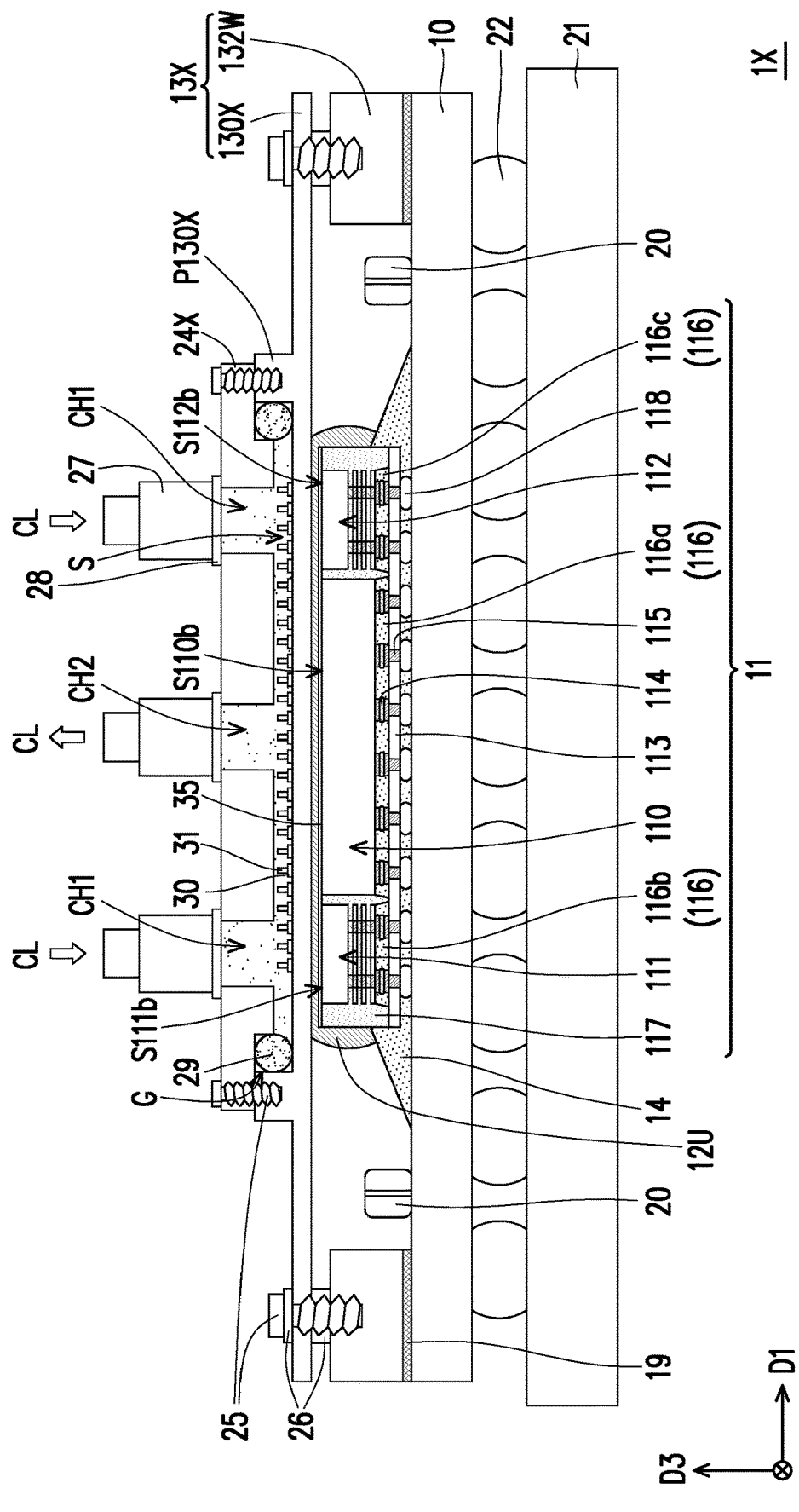

Referring to FIG. 25, a semiconductor device 1X may include a lid 13X and a cover 24X in addition to the substrate 10, the semiconductor package 11, the thermal conductive bonding layer 12U, the underfill 14, the bonding layer 19, the plurality of passive components 20, the printed circuit board 21, the connectors 22, the screws 25, the washers 26, the pipes 27, the washers 28, the O shaped seal ring 29, the plurality of bonding patterns 30, the plurality of pillars 31, and the adhesion enhancement layer 35 described above. In some alternative embodiments, the semiconductor device 1X further includes the adhesion enhancement layer 36 described above.

In the lid 13X, a plate portion 130X of the lid 13X has a protrusion portion P130X for screw fixing, and the protrusion portion P130X of the plate portion 130X and the cover 24X are fixed by the screws 25. In some embodiments, the screws 25 are screwed to the protrusion portion P130X from the cover 24X to facilitate disassembly.

In some embodiments, a portion of the plate portion 130X (e.g. the portion of the plate portion 130X that is outside the protrusion portion P130X) can be thinned for the overall stiffness reduction.

Figure 26:
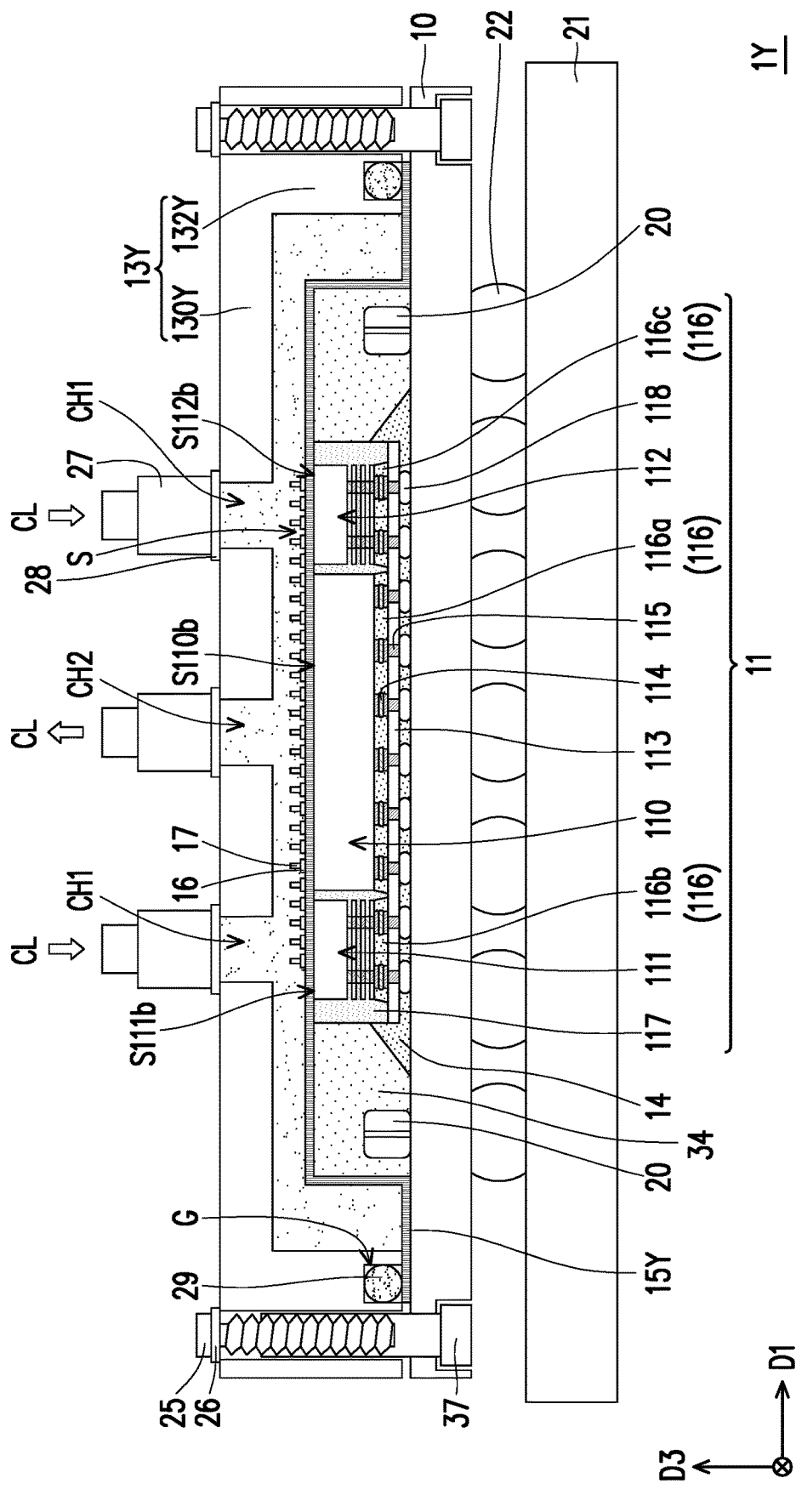

Referring to FIG. 26, a semiconductor device 1Y may include a lid 13Y, a backside metal layer 15Y, and sleeve nuts 37 in addition to the substrate 10, the semiconductor package 11, the underfill 14, the plurality of bonding patterns 16, the plurality of pillars 17, the plurality of passive components 20, the printed circuit board 21, the connectors 22, the screws 25, the washers 26, the pipes 27, the washers 28, the O shaped seal ring 29, and the encapsulant 34 described above.

The backside metal layer 15Y may be disposed on the semiconductor package 11, the encapsulant 34, and the substrate 10. The lid 13Y is disposed on the substrate 10. In some embodiments, the lid 13Y includes a plate portion 130Y and a frame portion 132Y. Design parameters (e.g., material, disposition relationship, or structural details) of the plate portion 130Y and the frame portion 132Y may be similar to those previously discussed with reference to the plate portion 130R and the frame portion 132R in FIG. 19, and will not be repeated here. In some embodiments, the plate portion 130Y and the frame portion 132Y are integrally formed. In some embodiments, the lid 13Y and the substrate 10 are fixed by the screws 25, the washers 26, the sleeve nuts 37 and the O shaped seal ring 29. The sleeve nuts 37 may be embedded into the frame portion 132Y of the lid 13Y from the bottom of the substrate 10. The screws 25 may be screwed into the sleeve nuts 37 and secured by the washers 26 on the frame portion 132Y. The ring shaped groove G may be located at the bottom of the frame portion 132Y, and the O shaped seal ring 29 may be disposed on the backside metal layer 15Y and located in the ring shaped groove G in the frame portion 132Y. The coolant CL is able to flow into and out of the space S between the plate portion 130Y, the frame portion 132Y, the backside metal layer 15Y, the plurality of bonding patterns 16, and the plurality of pillars 17.

Figure 27:
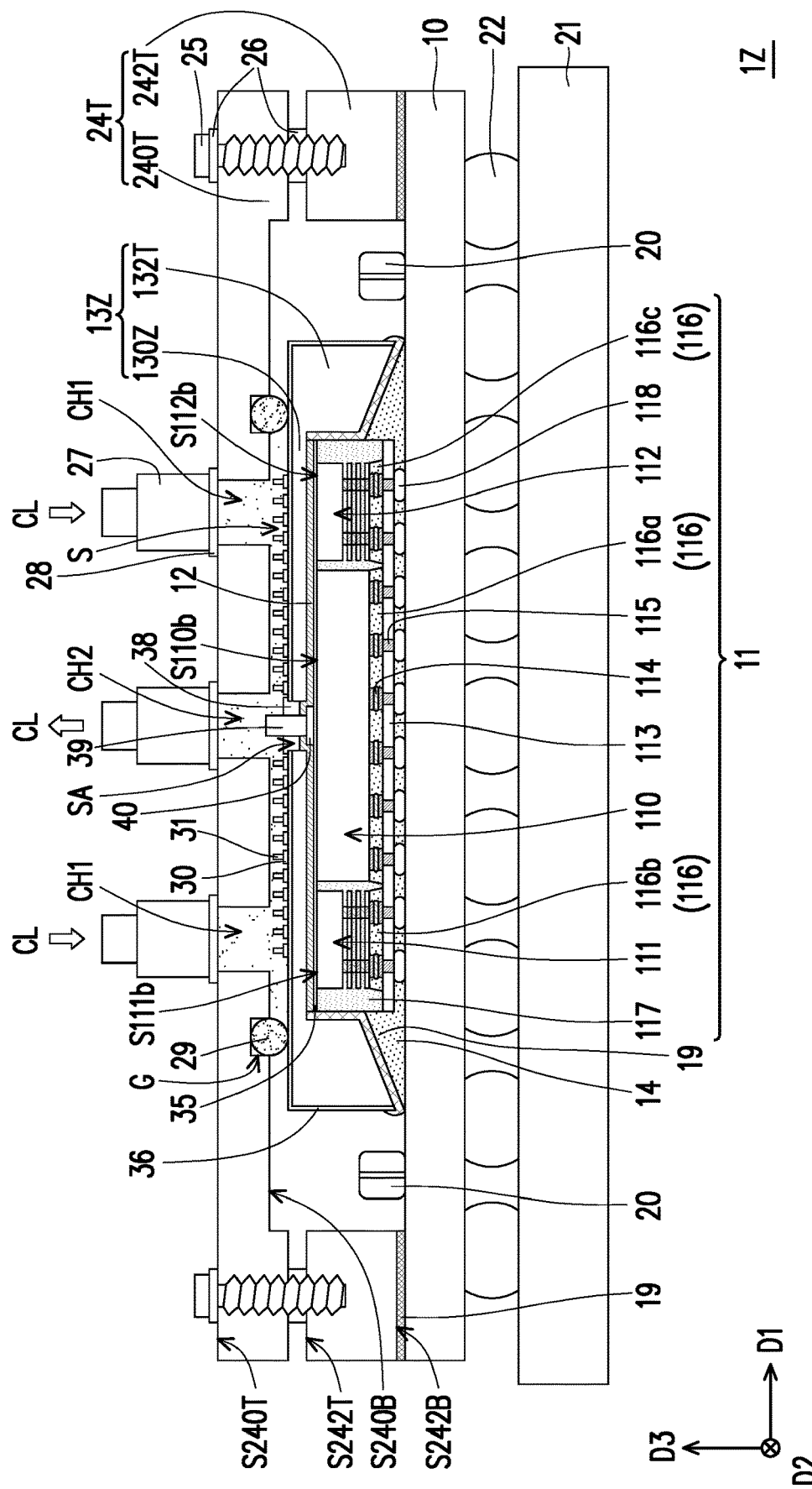

Referring to FIG. 27, a semiconductor device 1Z may include a lid 13Z, a thermal conductive material layer 38, a thermal conductive body 39, and a pad 40 in addition to the substrate 10, the semiconductor package 11, the underfill 14, the bonding layer 19, the plurality of passive components 20, the printed circuit board 21, the connectors 22, the screws 25, the washers 26, the pipes 27, the washers 28, the O shaped seal ring 29, the plurality of bonding patterns 30, the plurality of pillars 31, the adhesion enhancement layer 35, and the adhesion enhancement layer 36 described above.

The lid 13Z is similar to those previously discussed with reference to the lid 13T in FIG. 21. However, the lid 13Z includes two parts separated from each other and respectively covered on opposite sides of the semiconductor package 11 in the first direction D1. Specifically, each of the two parts includes a plate portion 130Z and a frame portion 132T connected to the plate portion 130Z, and a space SA is between the plate portions 130Z of the two parts. A portion of the thermal conductive bonding layer 12 is located in the space SA, and the thermal conductive material layer 38 is filled in the space SA. A method of forming the thermal conductive material layer 38 and a material of the thermal conductive material layer 38 may be similar to those previously discussed with reference to the thermal conductive bonding layer 12, and will not be repeated here.

In some embodiments, the thermal conductive body 39 is located in the space SA and spaced apart from the plate portion 130Z of each of the two parts, and the thermal conductive material layer 38 is filled between the plate portion 130Z of each of the two parts and the thermal conductive body 39. A method of forming the thermal conductive body 39 and a material of the thermal conductive body 39 may be similar to those previously discussed with reference to the plurality of pillars 31, and will not be repeated here.

In some embodiments, the pad 40 is disposed on the adhesion enhancement layer 35 and located between the thermal conductive body 39 and the adhesion enhancement layer 35. A method of forming the pad 40 and a material of the pad 40 may be similar to those previously discussed with reference to the plurality of bonding patterns 30, and will not be repeated here. In some embodiments, the pad 40 and the thermal conductive body 39 are sequentially formed on the adhesion enhancement layer 35, and the thermal conductive bonding layer 12 is formed on the adhesion enhancement layer 35 subsequent to the thermal conductive body 39. In such embodiments, the pad 40 may be covered by the thermal conductive bonding layer 12.

In some alternative embodiments, the pad 40 is omitted. In some alternative embodiments, the thermal conductive body 39 and the pad 40 are omitted. In some alternative embodiments, the design parameter (e.g., number, position, length, width, height, depth, etc.) of the space SA, the thermal conductive body 39 and the pad 40 may be changed.

In an embodiment, a semiconductor device includes a substrate, a semiconductor package, a thermal conductive bonding layer, and a lid. The semiconductor package is disposed on the substrate. The thermal conductive bonding layer is disposed on the semiconductor package. The lid is attached to the thermal conductive bonding layer and covers the semiconductor package to prevent coolant from contacting the semiconductor package.

In an embodiment, a semiconductor device includes a substrate, a semiconductor package, an underfill, an encapsulant, a backside metal layer, a plurality of bonding patterns, a plurality of pillars, a lid, and an O shaped seal ring. The semiconductor package is disposed on the substrate. The underfill is disposed between the semiconductor package and the substrate. The encapsulant is disposed on the underfill and the substrate. The backside metal layer is disposed on the semiconductor package and the encapsulant, wherein the backside metal layer is a stacked layer of at least three layers. The plurality of bonding patterns are disposed on the backside metal layer and located over the semiconductor package. The plurality of pillars are disposed on the plurality of bonding patterns. The lid includes a plate portion and a frame portion, wherein the plate portion covers the semiconductor package, the encapsulant and the frame portion, and the plate portion is supported by the frame portion on the substrate. The O shaped seal ring is disposed on the backside metal layer. The plate portion includes an inflow channel and an outflow channel to allow coolant to flow into and out of a space between the plate portion, the O shaped seal ring, the backside metal layer, the plurality of bonding patterns, and the plurality of pillars.

In an embodiment, a semiconductor device includes a substrate, a semiconductor package, an underfill, an encapsulant, a backside metal layer, a plurality of bonding patterns, a plurality of pillars, a lid, and an O shaped seal ring. The semiconductor package is disposed on the substrate. The underfill is disposed between the semiconductor package and the substrate. The encapsulant is disposed on the underfill and the substrate. The backside metal layer is disposed on the semiconductor package, the encapsulant, and the substrate. The plurality of bonding patterns are disposed on the backside metal layer and located over the semiconductor package. The plurality of pillars are disposed on the plurality of bonding patterns. The lid includes a plate portion and a frame portion, wherein the plate portion covers the semiconductor package and the encapsulant, the frame portion is located at edges of the plate portion and is fixed on the substrate. The O shaped seal ring is disposed on the backside metal layer and located in the frame portion. The plate portion includes an inflow channel and an outflow channel to allow coolant to flow into and out of a space between the plate portion, the frame portion, the backside metal layer, the plurality of bonding patterns, and the plurality of pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor package disposed on the substrate;
   a lid comprising:
      a plate portion covering the semiconductor package; and
      a frame portion protruding from edges of the plate portion towards the substrate, wherein the semiconductor package is enclosed by the substrate, the frame portion and the plate portion;
   a backside metal layer disposed on the semiconductor package and between the lid and the semiconductor package; and
   a thermal conductive bonding layer disposed on the backside metal layer and between the lid and the backside metal layer, wherein the thermal conductive bonding layer comprises a plurality of bonding patterns in direct contact with the lid and the backside metal layer.

2. The semiconductor device as claimed in claim 1, further comprising:
a first bonding layer bonding the plate portion on the semiconductor package, wherein a bottom surface of the plate portion is spaced apart from the backside metal layer via the thermal conductive bonding layer and the first bonding layer.

3. The semiconductor device as claimed in claim 1, further comprising:
a second bonding layer bonding the lid on the substrate, wherein the semiconductor package is surrounded by the second bonding layer.

4. The semiconductor device as claimed in claim 3, further comprising:
an underfill disposed between the semiconductor package and the substrate; and
a passive component disposed on the substrate and between the underfill and the second bonding layer.

5. A semiconductor device, comprising:
a substrate;
a semiconductor package disposed on the substrate;
a thermal conductive bonding layer disposed on the semiconductor package;
a lid, wherein the semiconductor package is enclosed by the substrate and the lid;
a cover disposed on the lid;
a plurality of pillars disposed over the semiconductor package and located between the lid and the cover; and
a plurality of bonding patterns disposed on the lid and located between the plurality of pillars and the lid.

6. The semiconductor device as claimed in claim 5, wherein the cover comprises at least one inflow channel and at least one outflow channel to allow a coolant to flow into and out of a space between the lid and the cover.

7. The semiconductor device as claimed in claim 5, wherein the lid and the cover are fixed together through screws, welding, buckles, a seal ring or a combination thereof.

8. The semiconductor device as claimed in claim 5, wherein the lid comprises:
a plate portion attached to the thermal conductive bonding layer and covering the semiconductor package; and
a frame portion located at edges of the plate portion and protruding towards the substrate and the cover, wherein the semiconductor package is enclosed by the substrate, the frame portion and the plate portion, and the semiconductor device further comprises:
a first bonding layer bonding the plate portion on the semiconductor package and surrounding the thermal conductive bonding layer.

9. The semiconductor device as claimed in claim 8, wherein one of a top surface of the frame portion and a bottom surface of the cover has ring shaped grooves, and the semiconductor device further comprises:
O shaped seal rings secured by the ring shaped grooves.

10. The semiconductor device as claimed in claim 8, further comprising:
a backside metal layer disposed between the first bonding layer and the semiconductor package.

11. The semiconductor device as claimed in claim 3, further comprising:
an underfill disposed between the semiconductor package and the substrate; and
a passive component disposed on the substrate and between the underfill and the frame portion, wherein the lid further comprises:
an auxiliary support portion protruding from a bottom surface of the plate portion towards the substrate, wherein the auxiliary support portion is located between the semiconductor package and the passive component and supported between the plate portion and the underfill.

12. The semiconductor device as claimed in claim 11, further comprising:
a second bonding layer bonding the lid on the substrate.

13. The semiconductor device as claimed in claim 12, wherein the second bonding layer is further located between the auxiliary support portion and the underfill and between the auxiliary support portion and the semiconductor package.

14. The semiconductor device as claimed in claim 5, wherein the lid is enclosed by the cover and the substrate, and the semiconductor device further comprises:
a first adhesion enhancement layer disposed between the thermal conductive bonding layer and the semiconductor package; and
a second adhesion enhancement layer disposed on the lid and in contact with the plurality of bonding patterns and the lid.

15. The semiconductor device as claimed in claim 14, further comprising:
an underfill disposed between the semiconductor package and the substrate;
a passive component disposed on the substrate and between the underfill and the cover; and
a second bonding layer bonding the cover on the substrate.

16. The semiconductor device as claimed in claim 15, wherein the second bonding layer is further located between the lid and the underfill and between the lid and the semiconductor package.

17. The semiconductor device as claimed in claim 15, wherein the second bonding layer is in contact with the first adhesion enhancement layer and the second adhesion enhancement layer.

18. The semiconductor device as claimed in claim 15, wherein the thermal conductive bonding layer further extends to sidewalls of the semiconductor package and contacts the underfill.

19. A semiconductor device, comprising:
a substrate;
a semiconductor package disposed on the substrate;
a lid disposed over the semiconductor package;
a backside metal layer disposed on the semiconductor package and located between the lid and the semiconductor package;
a plurality of pillars disposed over the semiconductor package and located between the lid and the backside metal layer; and
a plurality of bonding patterns disposed on the backside metal layer and located between the plurality of pillars and the backside metal layer.

20. The semiconductor device as claimed in claim 19, further comprising:
an underfill disposed between the semiconductor package and the substrate;
a passive component disposed on the substrate and between the underfill and the lid; and
an encapsulant covering the passive component and the underfill, wherein the encapsulant is in contact with the backside metal layer.

* * * * *